US007454312B2

(12) United States Patent
Weiher et al.

(10) Patent No.: US 7,454,312 B2
(45) Date of Patent: Nov. 18, 2008

(54) TOOL HEALTH INFORMATION MONITORING AND TOOL PERFORMANCE ANALYSIS IN SEMICONDUCTOR PROCESSING

(75) Inventors: Susan Weiher, Bannewitz (DE); Stefan Soens, Dresden (DE)

(73) Assignee: Applied Materials, Inc., Santa Clara, CA (US)

( * ) Notice: Subject to any disclaimer, the term of this patent is extended or adjusted under 35 U.S.C. 154(b) by 135 days.

(21) Appl. No.: 11/375,908

(22) Filed: Mar. 15, 2006

(65) Prior Publication Data

US 2007/0219738 A1  Sep. 20, 2007

(51) Int. Cl.
*G06F 15/00* (2006.01)
*G06F 17/18* (2006.01)
*G06F 19/00* (2006.01)

(52) U.S. Cl. .................................................. 702/179
(58) Field of Classification Search .................. 702/34, 702/35, 179; 700/110, 121; 438/14
See application file for complete search history.

(56) References Cited

U.S. PATENT DOCUMENTS

| | | | |
|---|---|---|---|
| 5,649,169 A | | 7/1997 | Berezin et al. |
| 5,761,064 A | | 6/1998 | La et al. |
| 5,777,901 A | | 7/1998 | Berezin et al. |
| 5,787,021 A | | 7/1998 | Samaha |
| 5,886,896 A | * | 3/1999 | Lantz et al. .................. 700/116 |
| 5,896,294 A | * | 4/1999 | Chow et al. .................. 700/121 |
| 5,930,138 A | | 7/1999 | Lin et al. |
| 5,978,751 A | | 11/1999 | Pence et al. |
| 6,017,771 A | | 1/2000 | Yang et al. |
| 6,097,887 A | | 8/2000 | Hardikar et al. |
| 6,314,379 B1 | | 11/2001 | Hu et al. |
| 6,324,481 B1 | | 11/2001 | Atchison et al. |
| 6,704,691 B2 | * | 3/2004 | Chiou .......................... 702/188 |
| 6,763,130 B1 | | 7/2004 | Somekh et al. |
| 2003/0182014 A1 | | 9/2003 | McDonnell et al. |
| 2004/0102857 A1 | * | 5/2004 | Markle et al. .................. 700/2 |
| 2004/0252134 A1 | | 12/2004 | Bhatt et al. |

(Continued)

FOREIGN PATENT DOCUMENTS

EP    0910123 A1    4/1999

(Continued)

OTHER PUBLICATIONS

J. Durham, et al. "A Statistical Method for Correlating In-Line Defectivity to Probe Yield" IEEE/SEMI Advanced Semiconductor Manufacturing Conference and Workshop, pp. 76-77 (1997).

(Continued)

*Primary Examiner*—Michael P Nghiem
(74) *Attorney, Agent, or Firm*—Blakely Sokoloff Taylor & Zafman LLP

(57) ABSTRACT

A computer-implemented method, system and computer program device are provided for monitoring production of semiconductor products to detect potential defect excursions. Equipment based data is collected reflecting equipment performance for a plurality of semiconductor manufacturing tools used for processing a plurality of semiconductor products. Also, product level data is collected reflecting product quality for the plurality of semiconductor products processed on the plurality of manufacturing tools. At least a portion of the product level data and at least a portion of the equipment based data are then correlated. At least one report is generated of the correlation of data.

30 Claims, 13 Drawing Sheets

U.S. PATENT DOCUMENTS

2007/0219738 A1 9/2007 Weiher et al.

FOREIGN PATENT DOCUMENTS

EP 1071128 A2 1/2001

OTHER PUBLICATIONS

W. Shindo et al., "Excursion Detection and Source Isolation in Defect Inspection and Classification" International Workshop on Statistical Meterology, pp. 90-93 (1997).

K. W. Tobin et al., "Field Test Results of an Automated Image Retrieval System" IEEE/SEMI, Advanced Semiconductor Manufacturing Conference (2001).

* cited by examiner

| TOOL ID | SYSTEM | APPLICATION(S) | CHAMBER A/1 | CHAMBER B/2 |
|---|---|---|---|---|
| CVD 30 | PRODUCER UP | SiN / SiON | $SiH_4$ TWIN UP | $SiH_4$ TWIN UP |
| CVD 40 | PRODUCER UP | SiN / SiON | $SiH_4$ TWIN UP | $SiH_4$ TWIN UP |
| CVD 41 | PRODUCER UP | SiN / SiON | $SiH_4$ TWIN UP | $SiH_4$ TWIN UP |
| CVD 50 | PRODUCER DO | SiN / SiON | $SiH_4$ TWIN DO | $SiH_4$ TWIN DO |
| CVD 51 | PRODUCER UP | SiN / SiON | $SiH_4$ TWIN UP | $SiH_4$ TWIN UP |
| CVD 60 | PRODUCER UP | TEOS - OXIDE | TEOS TWIN UP | TEOS TWIN DO |
| CVD 61 | PRODUCER UP | TEOS - OXIDE | TEOS TWIN UP | TEOS TWIN UP |
| CVD 70 | PRODUCER UP | TEOS - OXIDE | TEOS TWIN UP | TEOS TWIN UP |
| CVD 71 | PRODUCER UP | TEOS - OXIDE | TEOS TWIN UP | TEOS TWIN UP |
| HDP 10 | CENTURA UP | ILD / STI | HDP OXIDE UP | HDP OXIDE UP |
| CD 50 | OPAL DRSEM UP | CFM | | |
| DEF 25 | ORBOT WF UP | CFM | | |
| DEF 43 | ORBOT WF UP | FILMS | | |
| DEF 63 | ORBOT WF UP | POLISH | | |
| ET 10 | CENTURA UP | ZLE | MxP POLY (PE) UP | MxP POLY (PE) UP |
| ET 20 | CENTURA UP | STI | MxP POLY (PE) UP | MxP POLY (PE) UP |
| ET 40 | CENTURA UP | POLY GATE ETCH | MxP POLY (PE) DO | MxP POLY (PE) UP |
| ET 70 | CENTURA UP | TRENCH-OXIDE | eMxP+ UP | eMxP+ UP |
| ET 80 | CENTURA UP | TRENCH-OXIDE | eMxP+ UP | eMxP+ UP |
| ET 100 | CENTURA UP | METAL ETCH | DPS UP | DPS UP |
| ET 111 | CENTURA UP | IPS OXIDE(VIA) | IPS UP | IPS UP |
| ET 140 | CENTURA UP | PAD | eMxP+ UP | eMxP+ UP |
| MD 10 | ENDURA UP | CO - Ti | TITANIUM UP | COBALT UP |
| MD 20 | ENDURA UP | TA/Cu SEED | TANTALUM (IMP) UP | COPPER (IMP) UP |
| MD 50 | ENDURA DO | INTERCONNECT | TITANIUM DO | TIN UP |
| MD 60 | ENDURA UP | LI/BARRIER | TITANIUM (IMP) UP | TIN (CVD) UP |
| POL 40 | MIRRA UP | COPPER | COPPER UP | COPPER UP |
| POL 42 | MIRRA UP | STI | OXIDE UP | OXIDE UP |
| RTA 10 | CENTURA UP | CoSi | xE / atm UP | xE / atm UP |
| RTA 20 | CENTURA UP | IMPLANT ANNEAL | xE / atm UP | xE / atm UP |

MAIN APPLICATION: ETCH CVD MD RTA

GO TO =>
MAIN SCREEN:

TOOL QUALIFICATION:
 PROCEDURE
 PARTICLES-MECH.
 PARTICLES-INFILM
 PARTICLES-BACKSIDE
 THICKNESS
 RESISTANCE
 STRESS
 ETCH RATE
SYSTEM PERFORMANCE

TOOL MONITORING:
 DEFECT DENSITY
 ADC
 CD MEASUREMENTS
 EXCURSIONS

ADMINISTRATION:
 TOOL CONFIGURATION
 TOOL QUALF. SPECS
 SET-UP

CREATE DKL CASE STUDY
CREATE DKL BASEL. STUDY

FIG. 1A

| POLISH | PDC | OTHER | ALL |
|---|---|---|---|
| CHAMBER C/3 | CHAMBER D/4 | TOOL STATUS | COMMENTS |
| ---- | | WARRANTY | FEOL |
| ---- | | WARRANTY | BEOL – PRE CU |
| ---- | | SU | BEOL – PRE CU |
| SIH₄ TWIN DO | | SU | BEOL – POST CU |
| SIH₄ TWIN UP | | TO BE SHIPPED | BEOL – POST CU |
| TEOS TWIN UP | | WARRANTY | BEOL – PRE CU |
| TEOS TWIN UP | | TO BE SHIPPED | BEOL – PRE CU |
| TEOS TWIN UP | | SU | BEOL – POST CU |
| TEOS TWIN UP | | SU | BEOL – POST CU |
| ---- | ---- | WARRANTY | |
| | | SU | FEOL – CFM |
| | | WARRANTY | 3x, 5x, 10x OBJECT. |
| | | WARRANTY | 3x, 5x, 10x OBJECT. |
| | | WARRANTY | 3x, 5x, 10x OBJECT. |
| MxP Poly (PE) UP | MxP Poly (PE) UP | SU | FEOL |
| eMxP+ UP | eMxP+ UP | WARRANTY | FEOL |
| RPS UP | RPS UP | WARRANTY | FEOL |
| eMxP+ UP | eMxP+ UP | SU | BEOL – PRE CU |
| eMxP+ UP | ---- | SU | BEOL – POST CU |
| ASP+ UP | ASP+ UP | WARRANTY | BEOL |
| IPS UP | IPS UP | SU | BEOL – POST CU |
| eMxP+ UP | ---- | SU | BEOL – PRE CU |
| COBALT UP | TITANIUM UP | WARRANTY | BEOL – PRE CU |
| COPPER (IMP) UP | TANTALUM (IMP) UP | SU | BEOL – POST CU |
| TIN DO | AlCu DO | WARRANTY | BEOL |
| TIN (CVD) UP | ---- | WARRANTY | BEOL |
| OXIDE/TA UP | | WARRANTY | CHAMBER = PLATEN |
| OXIDE UP | | SU | CHAMBER = PLATEN |
| ---- | ---- | WARRANTY | BEOL – PRE CU |
| ---- | ---- | WARRANTY | FEOL |
| 127 | 129 | 131 | 133 |

TOOL QUALIFICATION DATA – PARTICLES INFILM

| ETCH | CVD | MD | RTA | POLISH | INSPEC. | OTHER | ALL |

TOOL QUALIFICATION DATA – PARTICLES INFILM
GENERAL SYSTEM DATA: AMD TOOL ID: CVD 40
AMAT TOOL ID: V006
CHAMBER A: SiH4 TWIN
CHAMBER B: SiH4 TWIN
CHAMBER C: —

APPLICATION:
WAFER USED: BARE SILICON (RECLAIM)
METROLOGY TOOL: TENCOR SPI
SPEC# ADDERS: <15# 0,2,4
SPEC# PRE: <10 COUNTS

APPLICATION: UV-NITRIDE (PASSALVATION) — 303
AVERAGE SCALE: LAST WEEK / LAST QUARTER / LAST 6 MONTHS / LAST YEAR — 305

PULLDOWNS → 311
TREND CHART... WHEN CLICKING ON AVG. VALUE → 313

COMMENTS — 307

— 301, 302, 309, 315

CH: A LEFT, A RIGHT, B LEFT, B RIGHT, MIDDLE
LAST 2ND 3RD 4TH 5TH 6TH 7TH DEC 99 JAN 99 FEB 99 MAR 99

ADDERS (chart: 0–35, days 1–31, LEFT)

MAIN APPLICATION:

TOOL ID: CVD 30, CVD 40, CVD 41, CVD 50, CVD 51, CVD 60, CVD 61, CVD 70, CVD 71, HDP 10 — 319

GO TO =>
MAIN SCREEN:
TOOL QUALIFICATION:
 PROCEDURE
 PARTICLES – MECH
 PARTICLES – INFILM
 PARTICLES BACKSIDE
 THICKNESS
 RESISTANCE
 STRESS
 ETCH RATE
 UPTIME
 MWBC
 MTTR
 MTBF
TOOL MONITORING:
 ADC
 DEFECT DENSITY
 CD MEASUREMENTS
 EXCURSIONS
ADMINISTRATION:
 TOOL CONFIGURATION
 TOOL QUAL. SPACE — 321

TOOL MONITORING DATA – ADC

| ETCH | CVD | MD | RTA | POLISH | INSPEC. | OTHER | ALL |

MAIN APPLICATION:

GO TO =>
MAIN SCREEN:

TOOL QUALIFICATION:
 PROCEDURE
 PARTICLES – MECH.
 PARTICLES – INFILM
 PARTICLES – BACKSIDE
 THICKNESS
 RESISTANCE
 STRESS
 ETCH RATE
 UPTIME
 MWBC
 MTTR
 MTBF

TOOL MONITORING:
 DEFECT DENSITY
 ADC
 CD MEASUREMENTS
 EXCURSIONS

ADMINISTRATION:
 TOOL CONFIGURATION
 TOOL QUAL. SPECS.

TOOL ID
CVD 30
CVD 40
CVD 41
CVD 50
CVD 51
CVD 60
CVD 61
CVD 70
CVD 71
HDP 10

TOOL MONITORING DATA – ADC
GENERAL SYSTEM DATA: AMD TOOL ID: CVD 40
                     AMAT TOOL ID: V007
     CHAMBER A:  TEOS TWIN
     CHAMBER B:  TEOS TWIN
     CHAMBER C:  TEOS TWIN

INSPECTION STEP: K6-Li DEP Di
WAFER USED PRODUCT WAFER
METROLOGY TOOL: ORBOT WF 736

INSPECTION STEP NAME:
TIME FRAME TO ANALYZE:
 LAST MONTH AVG.
 3 MONTH AVERAGE
 6 MONTH AVERAGE
 1 YEAR AVERAGE

Legend: PC SMALL, PC BIG, SCRATCH, μ-SCRATCH, PATTERN, UNKNOWN

TIME FRAME TO ANALYZE: LAST 4 WEEKS

COMMENTS

TOOL HEALTH INFORMATION MONITORING AND TOOL PERFORMANCE ANALYSIS IN SEMICONDUCTOR PROCESSING

BACKGROUND OF THE INVENTION

1. Field of the Invention

The present application relates generally to the production of semiconductor products and, more particularly, to monitoring production of semiconductor products to detect potential defect excursions.

2. Related Art

In a manufacturing system, such as a semiconductor manufacturing system, products such as chips are manufactured on processing equipment such as a series of manufacturing tools. The products produced occasionally do not sufficiently conform to their specifications and are accordingly considered defective. Ideally, a manufacturing system would prevent defects before they occur, such that the system would not produce a defective product.

Hence, one goal in connection with manufacturing systems for semiconductor wafers is to manage and operate the system to reduce the resulting defects in the products (chips). However, large amounts of defect management and reduction activity are undesirable because such activity takes time and effort, and tends to increase production time and costs, without tangibly contributing to the actual manufacture of the products. At least some defect management and reduction activity is, nevertheless, necessary in order to attain a sufficiently acceptable product.

As a consequence, one major thrust of a defect reduction program is reducing the time that defect management and reduction takes away from manufacturing activity. Taken to an extreme, this focus would result in placing culprit processing equipment offline before it could have any significant negative effect on wafers.

Defective products can result from numerous potential problems, and therefore characterizing the source or sources of a defect can be difficult. One of many possible sources of a defect relates to the health of one or more of the many manufacturing tools on which the product is made. Other sources of problems, include, e.g., variations in raw product, adjustments to recipes, adjustments of specifications, temporary conditions of the tool (e.g., restart) and facility quality.

For some types of defects, such as those relating to stepper and/or etcher tools based on patterned and critical dimension ("CD") defects, the correlation between source of defect and product yield is relatively straightforward to ascertain. For others, the correlation between source of defect and product yield is not readily determined or available.

Further, at most fabrication facilities, the time from inspection of product to resolution of defect excursions can be several days to several months, depending on the understanding of tracing the root cause of the defect to the tool, and the ability to resolve the original problem with the equipment. Too often the characterization of the defect depends upon obtaining an individual report for the culprit tool, upon the skill of an engineer interpreting the report, and upon word of mouth transferring relevant information about equipment performance between users. With such delays and/or unpredictable exchanges of information, defect excursions tend to be analyzed after the fact, if at all.

Defect management and reduction activity conventionally tends to concentrate in one of two general categories: equipment monitoring and product monitoring. Both involve the inspection of device wafers, but the focus varies from locating defects at the equipment level, or detecting defects created by integrated production.

In the wafer fabrication art, one type of equipment monitoring takes the form of the daily qualification. Daily qualification information ("daily qual"), which can include, e.g., data on particle counts, deposition rate, uniformity, thickness, stress, etch rate, etc. is collected, typically at the start of the day, from numerous manufacturing tools (collectively, "tool health information"). Wafers, such as bare wafers, may be run through a tool for the purpose of obtaining information about tool performance. This information helps characterize the quality of the equipment itself. The tool health information that is collected varies depending on the type of tool and other factors including engineer preference.

Product monitoring information is separately collected relating, e.g., to product wafer measurements and movement from tool-to-tool. Additional information that can be separately collected relates to defect measurements specific to product wafers. This information relates to the quality of the products themselves.

Traditionally, the collected tool health and/or product measurement and movement information is reviewed days or even months after it is generated, if at all. Moreover, the tool health information and product wafer information are not correlated to each other, nor with other information such as from other similar tools (which can be used as a benchmark), other tools in the processing path, nor as a history. Further, such raw information is not conducive to sophisticated analyses such as for predicting trends.

Conventionally, engineers are provided with detailed information on a defect of a product. For example, if an excursion of large flakes is noted on a product wafer, engineers have access to pictures of flakes on the wafer, and a variety of information about the defect on the wafer itself. Unfortunately they have no convenient way of tracking the information about one or more individual wafers in relation to what happened on the tool on the relevant day. Unanswered questions may include: what was the bare wafer daily qualification information for the tool? Are there any hints in the relevant bare wafers at the relevant time(s) that could help solve the problem, such as chamber v. load-lock data which is not available through product wafer measurements?

Thus, there remains a need for a system or method permitting the use of, e.g., tool health information and product wafer information as it is generated, and the correlation of such information. There is also a need for a system that permits the analysis of trends that suggest or predict defect excursions. Further, there is still a need for a defect management methodology that reduces additional processing time needed, in contrast to typical defect measurements.

SUMMARY OF EMBODIMENTS OF THE INVENTION

In accordance with one or more embodiments of the invention, a computer-implemented method, system and computer program device are provided for monitoring production of semiconductor products to detect potential defect excursions. Equipment based data is collected reflecting equipment performance for a plurality of semiconductor manufacturing tools used for processing a plurality of semiconductor products. Also, product level data is collected reflecting product quality for the plurality of semiconductor products processed on the plurality of manufacturing tools. At least a portion of the product level data and at least a portion of the equipment based data are then correlated. At least one report is generated of the correlation of data.

In particular, one or more embodiments of the present invention provides for extracting data, such as daily qual data (e.g., particle counts, deposition rate, uniformity, thickness, stress, etch rate, etc.), from a workstream for any number of manufacturing tools, as well as collecting information relating to wafer movement from tool-to-tool, and defect measurements concerning wafers processed on the tools. The correlation of selected product level information (such as date processed, tool processed) and equipment based data, e.g., daily qual data, may be then determined. The collected information may be analyzed and relevant selected information may be used for preparation of reports such as various trend charts (which may be standardized and/or generated in real time) and overall bare wafer performance tracking. Inputs may be different per tool, data may be extracted per process tool, a view may be permitted of data and tool configuration off-line or over the web, and data may be stored in and/or transferred to a defect knowledge library (DKL) to provide e.g., a history of bare wafer tool monitoring data.

In accordance with one or more embodiments of the invention, a web-based reporting system is provided that captures bare wafer qualification information and tool configuration, used in connection with trend reports such as charts and images of defects, that may also be transferred to and/or stored in the DKL. These reports can show trends, such as a particular tool tending to produce thicker films. Thus, defect behavior can be predicted by reviewing the charts and the appropriate tool(s) can be adjusted before a trend is allowed to cause a critical situation or a defect excursion. As those skilled in the art will appreciate, the process can also be automated such that the information otherwise used to produce the charts can also be used to signal an alarm or take appropriate action and, e.g., automatically adjust an appropriate piece of equipment.

BRIEF DESCRIPTION OF THE FIGURES

The above mentioned and other advantages and features of various embodiments of the present invention will become more readily apparent from the following detailed description and the accompanying drawings, in which:

FIGS. 1A-B together are an example display page of a main page of a tool health reporting system according to one or more embodiments of the present invention.

FIG. 3 is an example display page of the reporting system of FIG. 1, showing tool qualification data for particles infilm for a particular tool.

FIG. 4 is another example display page of the reporting system of FIG. 1, showing tool monitoring data for automatic defect classification ("ADC") for a selected tool.

DETAILED DESCRIPTION

Figure 2:
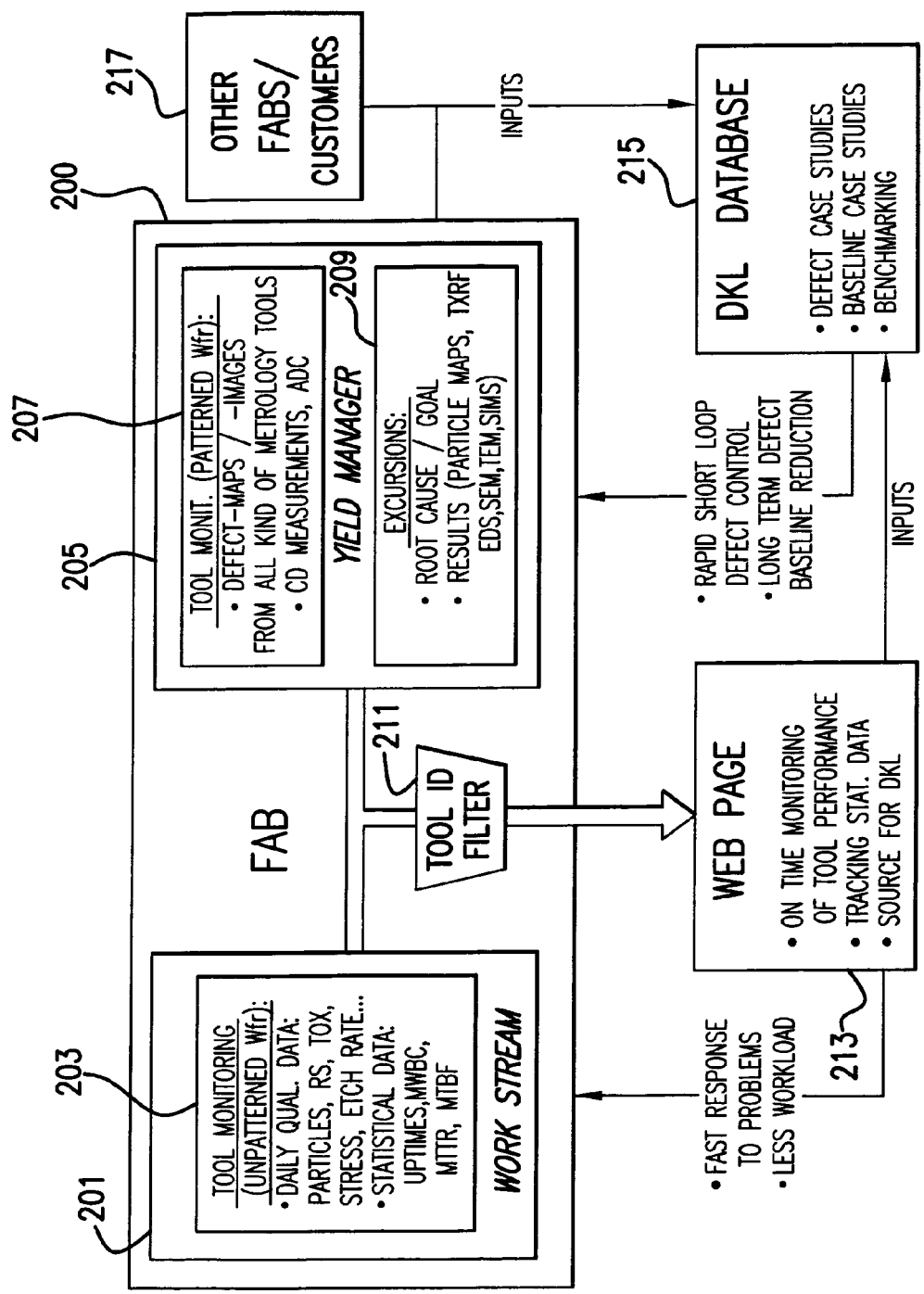
FIG. 2 is an example data flow diagram illustrating real time collection of and access to tool related performance information in accordance with one or more embodiments of the invention.

The following detailed description includes many specific details. The inclusion of such details is for the purpose of illustration only and should not be understood to limit the present invention. Throughout this discussion, similar elements are referred to by similar numbers in the various figures for ease of reference. In addition, features in one embodiment may be combined with features in other embodiments of the present invention.

"Equipment based data" concerns how a piece of equipment is working. It can include, e.g., one or more of the following: daily qualification information, unpatterned wafer measurements, patterned short loop wafer measurements, equipment electrical output signals (e.g., RF power, time, pressure, gas flow, etc.) and/or other tool data. Daily qualification information, such as particle counts, deposition rate, uniformity, thickness, stress, etch rate, etc. relating to the performance of various processes on bare wafers may be collected from several manufacturing tools. Equipment-based data could be collected from any wafer (unpatterned, patterned, or product) run through the tool where the data reflects on the tool health. (Product wafers could provide both equipment and product level data.) Typically this information is collected by a customer and stored by the customer in the customer's local storage.

"Product Level data" is associated with product quality, and includes, e.g., patterned wafer measurements and wafer defect measurements. It can be collected on a separate basis from equipment based data, and may include information on wafer movement from tool-to-tool. For example, a log of information is stored so that it can be determined when a wafer was moved from one tool to another specified tool. Such information may include, conventionally, a wafer identifier, tool identifier, and time of entry and exit; other information could also be provided. Additional product level data that may be collected relates to the defect measurements concerning wafers that were processed on the tools. For example, this information could include wafer thickness, resistance, stress, electrical performance (e.g. device speed, device yield, device resistances, etc.) and/or any other wafer measurement.

As will be explained in greater detail below, selected product level information (such as date-processed, tool-processed) may be used to correlate a particular wafer to a particular tool on which it was processed, and equipment based daily qualification data may be correlated to the particular wafers. The correlated information may be presented in various reports such as in trend charts displaying the correlation of measurements to defects of particular tools. This correlation may be presented over a period of time. The reports may be generated in real time according to one or more embodiments of the invention, as the information is collected. Variations on the foregoing are also provided for by the present invention.

The reports, e.g., graphs and/or tabular summaries, provided for by this invention may show trends, such as a particular tool tending to produce thicker films on product. Even where the measurement is within specification and does not by itself suggest a potential problem developing, an ordered collection, e.g., of successive elements such as selected measurements or other information, such as over time, might suggest a trend which if it follows its course will result in a problem.

Hence, one or more aspects of the present invention may assist in revealing integrated performance issues. For example, defect behavior may be analyzed and/or predicted by reviewing the reports. The appropriate tools may be adjusted accordingly, preferably before a trend is allowed to cause a critical situation or a defect excursion. In addition, embodiments of the present invention also envision that the information in the reports (and/or that information that was used to generate the reports) can be used in automated fashion to adjust the appropriate tool(s) using techniques known to those skilled in the art.

Reference is made to FIGS. 1A-B, which is an example of a main page of a tool health reporting system in accordance with one or more embodiments of the invention. In response to a user request for a tool health report, according to one or more embodiments of the present invention, the system produces a main page 101 enabling a user to select desired reports. The main page 101 indicates, e.g., the main categories of tool applications 103, including etch, chemical vapor deposition ("CVD"), metal deposition ("MD"), rapid thermal annealing ("RTA"), polish, PDC, and others. The user interface outputs a navigation bar 105, including the available types of reports. The available types of reports, e.g., may include tool qualification 107, tool monitoring 109, and administration 111. For example, the tool qualification 107 reports include procedures, mechanical particles, infilm particles, backside particles, thickness, resistance, stress, etch rate, and system performance. The tool monitoring reports, e.g., may include defect density, ADC, CD measurements and excursions. The administration reports 111, e.g., may include tool configuration, tool qualification specifications, and setup.

The user interface for the main application also may include a tool identifier listing 117, including, e.g., the identifiers assigned to each tool and used by the system. These tool identifications 117 may include, e.g., CVD 30, CVD 40 . . . , ET 10, ET 20 . . . . For each of these tools, the user interface at the main application level may indicate various available information. In this example, the available information corresponding to a tool includes the system 119 on which it is run, the application which is currently running on it 121, further information on chamber A 123, further information on chamber B 125, further information on chamber C 127 (if applicable), further information on chamber D 129 (if applicable), and other information on the tool status 131. The system information 119 may conveniently indicate the type and status of components of the system, such as the Producer™ tool. The application information 121 may conveniently indicate the type of application running on the system; this information may be tool dependent. In this example, the CVD 30 is running SiN/SiON application. The chamber A-D information 123, 125, 127, 129 may conveniently provide additional information specific to each chamber. In this example, the user can note that chambers A and B on CVD 30 are both an $SiH_4$ twin, both of which are up. Under the tool status column 131, information may be indicated such as warranty status, and location of the tool. An additional comment column 133 may be included for further text comments corresponding to a tool. The information which is provided may be adapted to suit the preferences of the users and/or the availability of information. Hence, other user interfaces may include some (or none) of the above information and reports, and/or other information and reports.

The user interface main application 101 also may include an indication of the types of reports which can be produced, in this example a DKL case study 113 and a DKL baseline study 115.

In this example of the main application page for user interface, the user may select one or more of the tool identifications 117, one of the report type subcategories 107, 109, 111, and/or indicate the type of report 113, 115 which is desired. Using the tool identifier, information type and the type of report, the system can then select the appropriate information and create an appropriate report. For example, if the user indicated a tool ID of CVD 60, information type of automatic defect classification ("ADC") and report type of DKL case study, the system would select the data representing ADC results, corresponding to the specific tool ID of CVD 60.

The example main page for the tool health reporting system as illustrated in FIGS. 1A and 1B may be utilized as a convenient way to access various detailed reports. Examples of these detailed reports are discussed in greater detail below in connection with FIGS. 3-6. However, it should be understood that the invention is not limited to these specific examples of user interfaces or the illustrated content.

Reference is now made to FIG. 2. As this block diagram generally shows, at least one embodiment of the present invention may be used in connection with a fab 200, which includes a workstream 201 and a yield manager 205. The workstream 201 provides, inter alia, equipment-based data reflecting information collected during equipment monitoring 203, e.g., unpatterned wafer data and/or patterned short loop wafer data. The unpatterned wafer data includes, without limitation, daily qual data, such as particles, RS tox, stress, etch rate, etc.; and statistical data, such as uptimes, mean wafers between cleans ("MWBC"), mean time to repair ("MTTR"), and mean time between failures ("MTBF"). The yield manager (205) provides, inter alia, product level data reflecting tool monitoring of product wafers 207, such as defect maps, images from various kinds of metrology tools, CD measurements, ADC and Spatial Signature Report ("SSR"); as well as excursions developed from measurements of the wafers 209, including root cause and/or goal, and results such as particle maps, total x-ray reflection fluorescence ("TXRF"), energy dispersive X-ray spectroscopy ("EDS"), scanning electron microscope ("SEM"), transmission electron microscope ("TEM") and secondary ion mass spectroscopy ("SIMS"). The collected information including the tool monitoring unpatterned wafer data 203, patterned wafer data 207 and excursion data 209 is correlated and filtered, such as by using, e.g., the illustrated tool ID filter 211. Other filters may be provided, e.g. utilizing time information, tool and chamber identifier, and/or based on an identified wafer. Filtered information may be displayed, such as on a web page 213, illustrating on-time monitoring of tool performance, tracking of statistical data, and DKL. The web page may be displayed not only to users of the fab 200, but as well to users of other fabs and other customers. The use of the web page via the correlation and filtering may provide for a faster response time to problems, and/or less workload for the engineers. The correlated data may be stored in a DKL database 215, for the development of defect case studies, baseline case studies, and/or benchmarking. The DKL information may further be used for rapid short loop defect control, and/or long-term defect baseline reduction. The DKL database 215 also collects information from other fabs and/or customers 217.

In one or more embodiments, the present invention may be implemented as a webpage system over the Internet, Intranet, and/or other computer network. Data may also be extracted from various computer systems on the network, and compiled; the compilation may be done at one or more points in the network. The compiled information may be then organized and displayed on a page such as the web page 213 in a manner that may permit a user to ascertain a trend.

Further, according to one or more embodiments of the present invention, the organized information may be itself stored for further use. The organized information could be stored with other collected information in the DKL 215, which may include stored historical information concerning various processing devices, for example. Any number of other types of storage systems can also be used, as well.

Conventionally, the various types of equipment and product information are the responsibility of and controlled by different personnel involved in the fabrication process, including the production engineers and the customer. These personnel typically collect and control separate information and typically do not exchange the information.

As an example of the disparate control of equipment and product information, the daily qual information may be collected prior to and/or during processing, by production engineers of the fab 200. As part of the daily qual, an engineer working for a customer at a customer facility may run a blank or unpatterned wafer on a processing tool to make sure that the uniformity is within specification, the deposition rates are within specification, the particle counts are in order, the etch rate is satisfactory, etc. The engineers may use this information to judge whether or not they can run product wafers on the tool. Usually this equipment-based information is stored in its raw format by the customer, such that the relevant information may be extracted later in the event of an error. Unfortunately, the information is typically in a format that is not standardized, varies from tool to tool, and is extremely difficult to extract later on. Blank or unpatterned wafer 203 information that may be collected includes, per wafer, e.g., select mechanical particles, in-film particles, deposition rate (e.g., film thickness, sputter rate), uniformity and removal rate (e.g., etch rate, polish rate), and/or resistance uniformity, among others.

Consider, however, a further example using one or more embodiments of the present invention where, about four weeks subsequent to generation of the daily qual information, a production engineer discovers a problem on his product wafers noted on different dates in connection with product data obtained by collecting patterned wafer data 207 (having later measured the wafer products). He or she wants to know what happened on some related dates. The equipment-based data, e.g., daily qual data, stored perhaps on an MES system or host system, has been collected at least four weeks earlier. According to at least one embodiment of the present invention, the engineer or other user may request relevant equipment based data, extracted from, e.g., the collected daily qual (at 203), and observe whether or not there is a trend in the uniformity performance and/or other behavior. For example, although each day the equipment may meet the specification, a series of product wafers exhibits a trend toward a defect. The actual defect is not detected until after it occurs because the series is not measured until the next day. However, the trend to a problem may be observed before defective wafers were produced. Referring to the products produced in the relevant 24-hour period, the user may observe that they were close to the specification limit, by viewing a display of the relevant information. The information also can be used to determine how to better control production in the future.

Thus, using aspects of the present invention, equipment based data, e.g., daily qual information (at 203) regarding the tool, is correlated to product data, e.g. defectivity information 205 obtained from product wafer measurements. Using the above example, product wafer measurements from a given day can be obtained, and it can be noted that the wafers have, e.g., an excursion of large flakes that are negatively impacting the yield. According to one aspect of the present invention, a user such as an engineer may use, e.g., product wafer defectivity information 205 together with, e.g., tool-based performance data 203 to increase the quality of the performance of the tools themselves and/or to predict and prevent the defects. Relevant information may be cross-referenced, e.g., by using the tool ID as a filter 211 to determine relevancy, perhaps together with time stamps.

Engineers may be using the reported information in attempting to fix a defect problem. The equipment-based data that is collected on a daily basis provides, in part, reported information that allows them to do so. Other levels of reported information and/or complexity of information may be provided. These may include, e.g., any data extracted from the tool or regarding the wafer, such as an MSC voltage performance, a radio frequency ("RF") match voltage performance, other electrical signals, pumps, pressures, and/or any other information that is collected regarding the physical behavior exhibited by the equipment. This other information is related back to product level data regarding the processing results for product wafers. Hence, one or more aspects of the present invention provides an ability to review one or more aspects of the behavior of the processing equipment and its effect on the products, e.g. wafers.

The tool performance report according to one or more embodiments of the present invention provides a perception of how the tools are running. The report may be presented on a web page 213, and/or any other appropriate way to provide information.

According to one or more embodiments, the present invention also includes a DKL 215, which can be a database or other computer-enabled device providing storage for some or all of the collected and/or reported data. The DKL may include information such as defect to wafer level information, and/or the equipment-based information. The wafer defect information may be manually typed in, as is conventional, e.g., at one or more fabs and/or customers' sites; or may be collected real time if supported by appropriate features of tools. Conventionally, the product-level data may be real time, and the equipment based data may not be real time. The DKL may include reports generated according to the present invention, as selected automatically or by a user. The defect knowledge library may be a database, such as SQL, that is readily available.

By using embodiments of the present invention to review the collected information, one may ascertain whether there is likely to be a defect problem, and one may determine the tool on which the defect was noted. Typically there is no information provided in the product level data correlating to the tool except the tool ID number and perhaps its location in the fab. No information has been provided in the product level data concerning the health of the tool. One or more aspects of the present invention provide a report, preferably on a real time basis, about the equipment-based data that is collected, e.g., from the tools, usually on a daily basis, sometimes weekly. If a typical system runs 5,000 wafers over a particular tool in a week, but only checks that tool once during the week, many products are at risk of being compromised without detection following the occurrence of an excursion. This makes it even more important that product level data is easily excisable to correlate to equipment behavior and the defect performance.

Reference is made to FIG. 3, an example of a display page 317 showing tool qualification data for particles infilm corresponding to a particular tool. According to one or more embodiments of the present invention, this detailed page is reached by a user via a main application screen. This example indicates that the user has selected particles infilm for tool qualification data, for the selected tool ID "CVD 40". A screen 301 is displayed for the selected data (particles in film) on the tool specified by the user. The data includes general system data 303 for the specified tool, including tool ID and tool information, together with chamber information and/or other information about the tool; the application information 305, in this case an etch application on a bare silicon chip, including the metrology tool, the number of adders noted in a specific time period and/or other relevant information; additional application pull-down menus 311, indicating other available application information; a pull-down menu for selection of a time period 313 and comments 315. This display includes a summary report 307 in tabular format together with a summary report 309 in graphical format, displaying the relevant numerical information for the selected data for the specified tool over the selected time period. The display also includes another tool identifier listing 319, navigation bar 321, and tool application bar 319.

Reference is made to FIG. 4, another example display page 409, in this instance showing tool monitoring data for ADC for a selected tool. The report in this instance includes general system data 402 relevant to the selected tool; inspection data 401 (since the selected report relates to tool monitoring, rather than tool qualification); a menu for selecting the inspection step 403; and a menu for selecting the relevant time period 405. Also included is a report 407 for the relevant tool, for the selected inspection application, over the selected time period. In this case, the display is provided as a bar graph, wherein the bar graph illustrates multiple measurements including PC small (small Particle Count), PC big (large Particle Count), scratch, micro scratch pattern, and unknown data. The display also includes another tool identifier listing 413, navigation bar 411, tool application bar 415, and comments 419.

Figure 5:
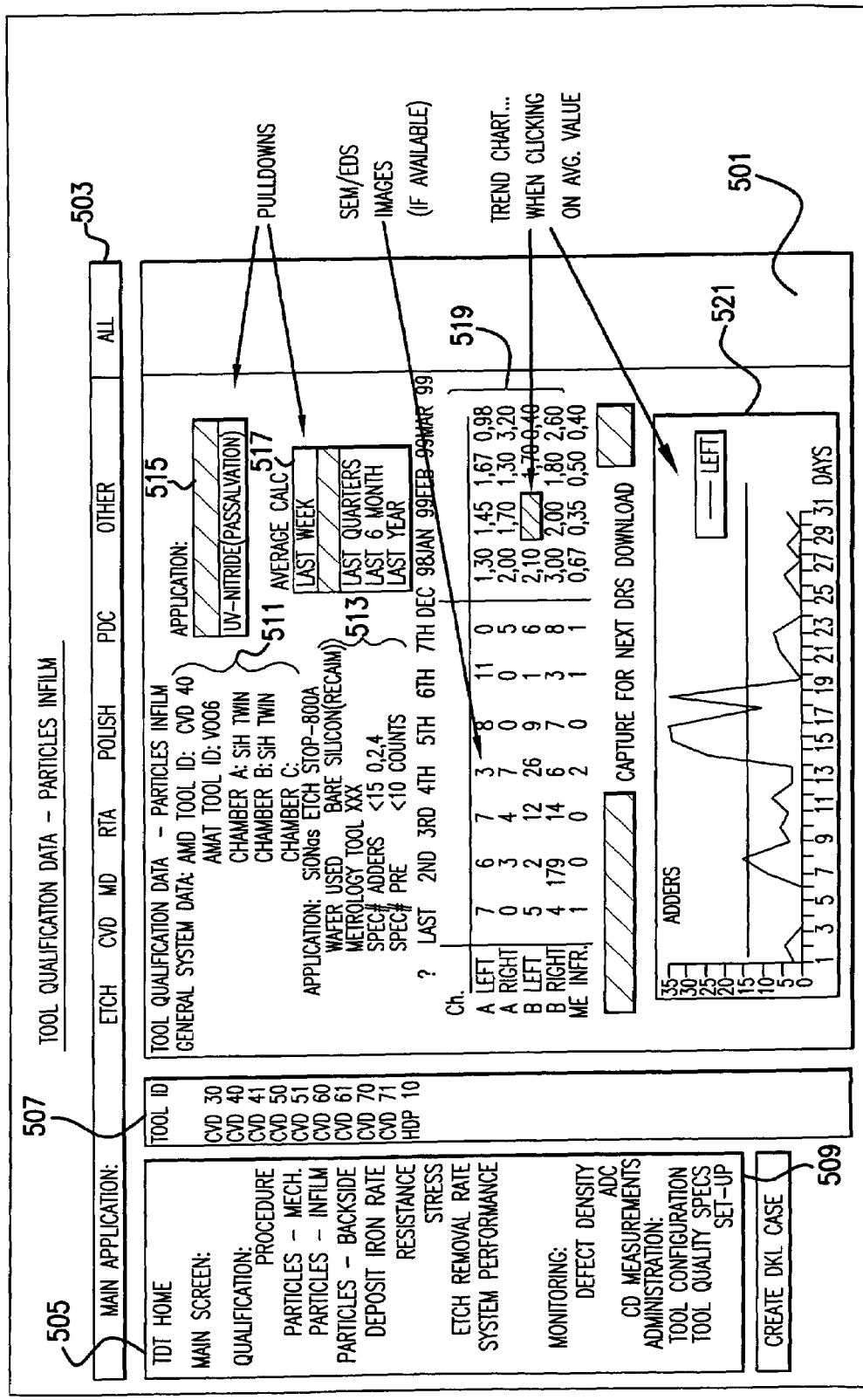
FIG. 5 is an example alternative display page of a tool performance report for the reporting system of FIG. 1, for the tool particles infilm data of FIG. 3.

Reference is made to FIG. 5, an example of an alternative display page 501 for tool qualification data for particles infilm. FIG. 5 is an alternative display to that shown in FIG. 3. Specifically, the example in FIG. 3 the left side of the numerical chart 307 shows information collected on a daily basis, and the right side shows an average (e.g., daily, weekly, or monthly); in contrast the numerical chart 519 in FIG. 5 provides a display of all such data. The report includes general system data 511, application information 513, application pull down menus 515, and time period menu 517. Note that the user may be permitted to click on any of the numerical entries, if applicable, in order to drill-down to detailed information if available, such as detailed wafer information, maps, SEM, energy-dispersive x-ray spectroscopy ("EDX"). Also in this example the trend chart has been generated for the chamber B left twin. The user may select and click on one of the other illustrated chambers, and a trend chart 521 corresponding to the selected chamber would then be displayed. The display also includes another tool identifier listing 507, navigation bar 505, tool application bar 503, and DKL case study command 509.

Figure 6:
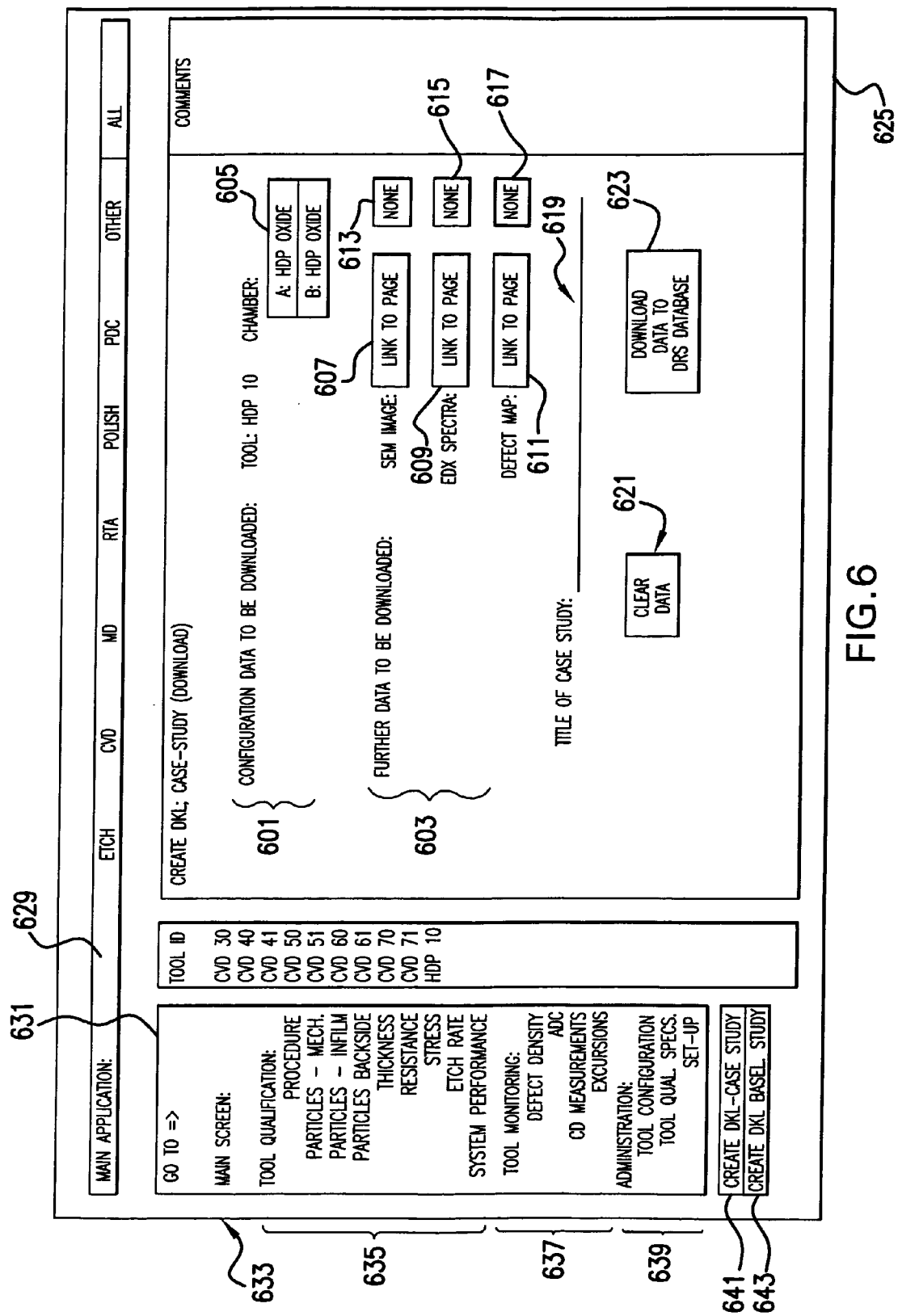
FIG. 6 is an example display page of a display knowledge link for the reporting system of FIG. 1.

Reference is now made to FIG. 6, one example for one or more embodiments of the present invention for a page 625 for creating a case study for inclusion in the DKL. By including a particular study in the DKL, trends for various types of tools can be noted, analyzed, and ultimately problems can be more readily solved. In this case, the menu provides that the user may specify the tool for which configuration data is to be downloaded 601, as well as the chamber of interest 605. The user may download additional data 603, including in this example, the SEM image 607, EDX spectra 609, and defect map 611. If preferred, the user may specify that none of the foregoing 613, 617, 617 is downloaded. One or more embodiments of the present invention provides that the user may specify a title for the case study 619. Advantageously, the user interface in this example provides a button 621 in order to clear the data, as well as a button 623 indicating that the data should be downloaded to the DKL database. The page also includes another tool identifier listing 631, navigation bar 633, tool application bar 629, DKL case study command 641 and DKL base study command 643. Reports may include, e.g., tool qualification 635, tool monitoring 637 and administration 639.

Figure 7:
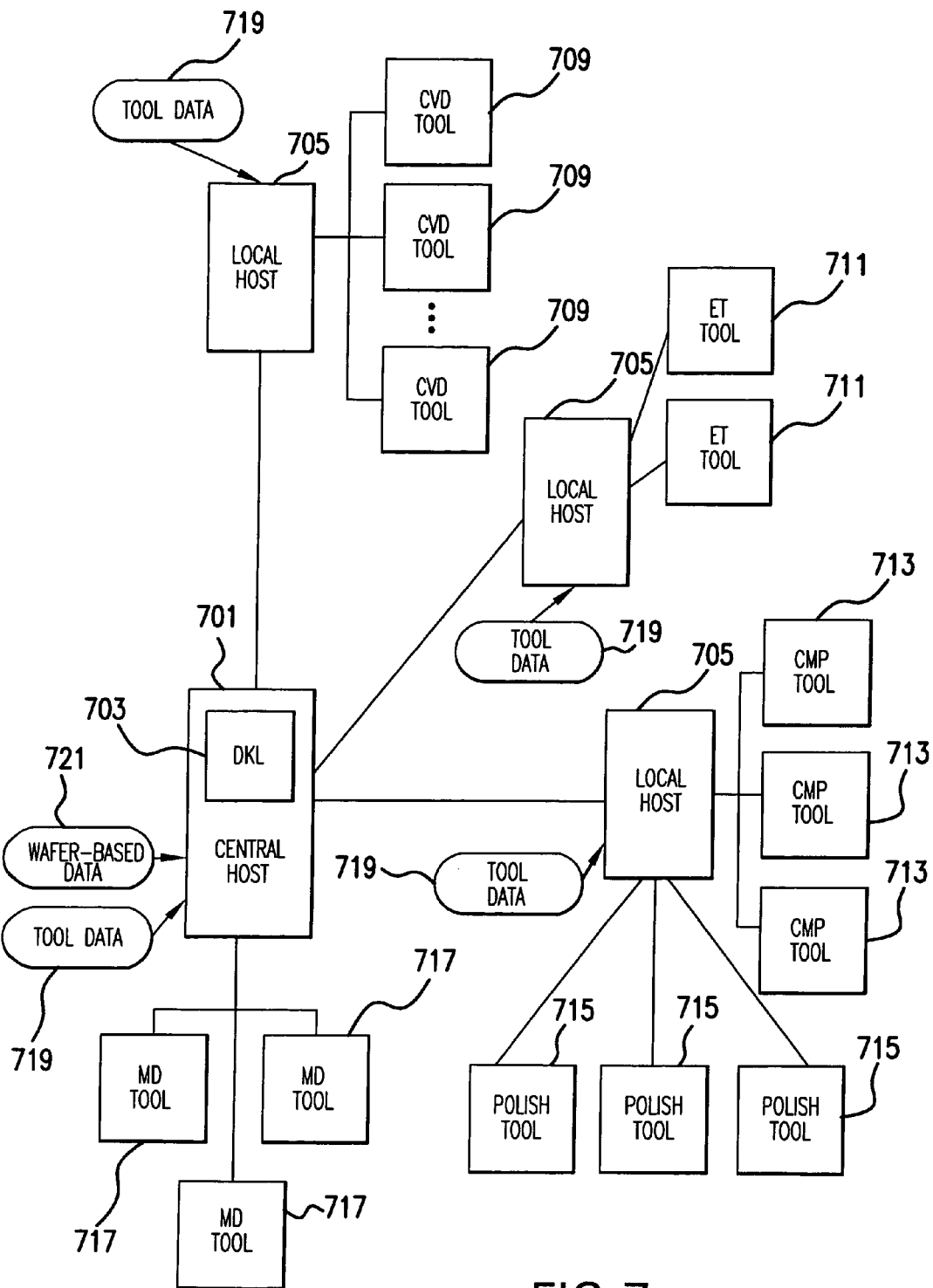
FIG. 7 is a block diagram of a computerized process control system that may be used in connection with one or more embodiments of the present invention.

FIG. 7 is a block diagram illustrating an example of a hardware configuration in connection with which one or more embodiments of the present invention might be used. The hardware includes a central host 701, which may provide central storage for the collected data. The DKL 703 resides in this example on the central host. The central host may be connected directly or indirectly to and may communicate with various local hosts 705 which may reside at customer sites and/or fabs. Each of the local hosts 705 may provide process control over various tools located at the fab. This illustrated embodiment is over-simplified in this regard to illustrate the concept. Here, the local hosts 705 may communicate with and control process tools including, e.g., CVD tools 709, etch tools 711, chemical-mechanical planarization ("CMP") tools 713, polish tools 715, and/or MD tools 717. Each of the local hosts 705 may collect other tool data 719. The central host may also communicate with tools, in this example, MD tools 717, may collect tool data 719 and/or may also collect other wafer-based data 721 from wafer measurements. The host(s) could be separate, or could be provided on the same computer system. Each local host or fab would include multiple tools as well as multiple types of tools.

Figure 8:
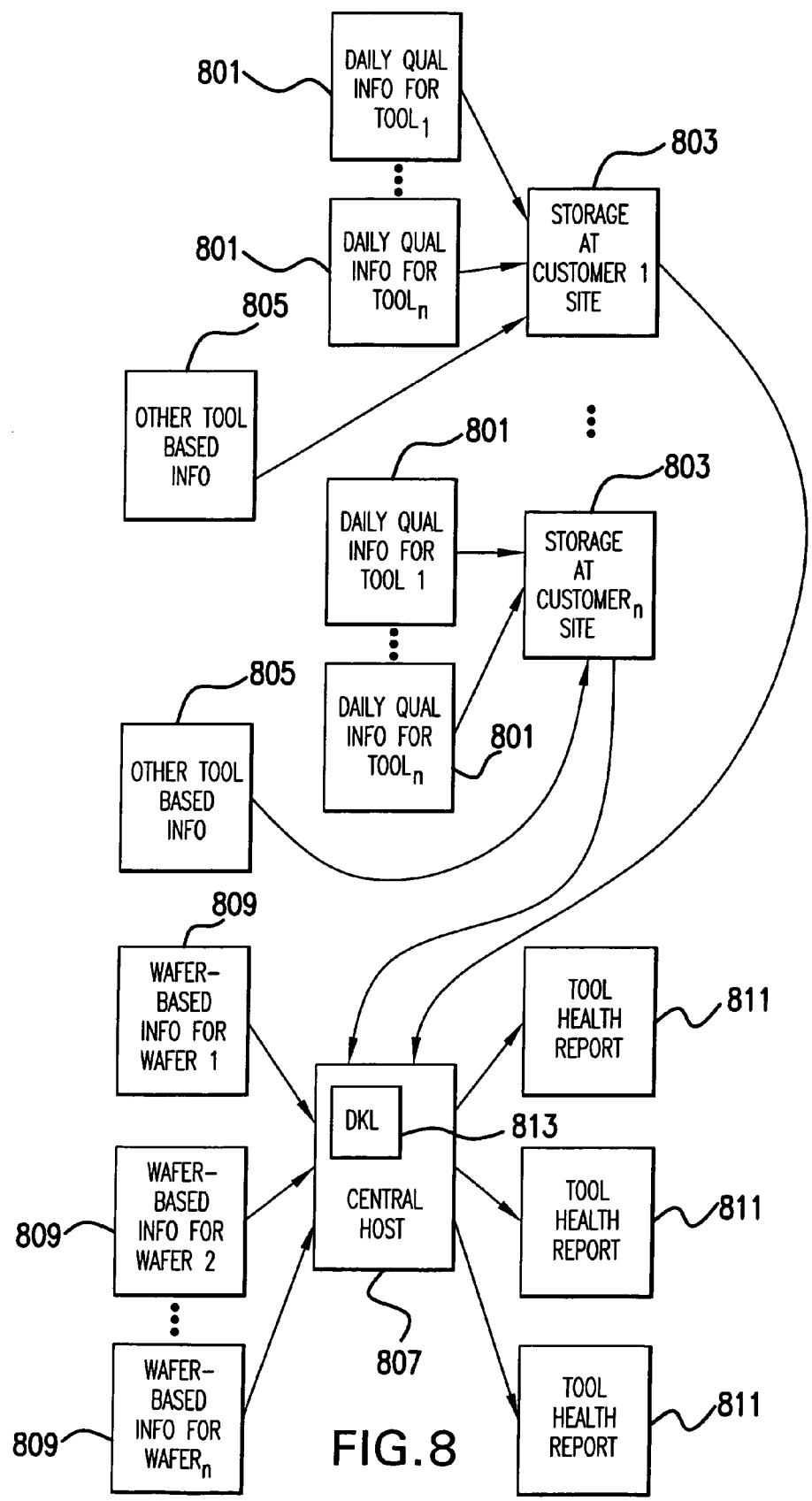
FIG. 8 is a data flow diagram illustrating the flow of data in accordance with one or more embodiments of the invention.

Reference is made to FIG. 8, which is one example of a data flow diagram for one or more embodiments of the present invention. The tools may collect equipment based data as follows. The daily qual data 801 may be obtained on a tool by an engineer who may manually initiate and take the measurements and/or manually enter the data into a spreadsheet in the manufacturing execution system ("MES") at the customer site 803, and/or at a site including a central host 807. The initiation of tool measurements and/or collection of daily qual data may (or may not) be automated. Other equipment based data 805 may also be collected. The bare wafer data 809 that is collected is obtained from another piece of equipment at a later time; either that information is manually taken down and entered, or that tool inputs the information, such as at the central host 807.

One or more embodiments of the present invention provide for the extraction of the collected (manually or automatically) equipment-based data from storage 803. (The method of entry of data into the host system at the fab or customer site may be left up to the customer's discretion.) The extraction of collected equipment-based data according to the present invention may be automated. That is, the equipment-based data may be automatically obtained from wherever it is available for computer-enabled retrieval, e.g., by periodic polling from the host system, by periodic downloads from the customer site, when the data is stored, and/or by any appropriate means of providing updated data. That information may be obtained on a real time basis, that is, when the data is electronically available such as when it is stored. When a manual entry is made into the MES system, one or more embodiments of the present invention may obtain the equipment-based data as soon as available or thereafter.

Although the equipment-based data may be collected and accessible, e.g., on a real time basis with respect to the entry of information into the host system 807, at the customer site 803, according to at least one embodiment of the invention it might not be collected on a real-time basis from the tool. For example, some data may be manually collected and entered into the system. The manual collection of information conventionally depends on the engineer's affirmative action initiating the entry, hence, there may be a delay. One of the traditional problems in the fab is that the defect engineers (typically not process equipment engineers) who are observing the wafer level defectivity do not have access in any automatic way to data about the tool performance. The tool performance data, on the other hand, is accessible to the process engineers. By collecting the data such as in the DKL 813, the present invention allows the defect engineers to have an overview of information traditionally accessible only by process engineers, regarding performance of the tools.

Previously, the defect engineers did not have an automated system to enable review of the equipment-based data; they would make a request for the data of the process engineer who entered it, and ask him to print out the stored results. One or more of the present invention are intended to be useful not only for the process engineers (that is, the tool owners) but also for the defect engineers. (The defect engineers conventionally are responsible for tracking what the wafer defects are, determining why they happened, and tracking statistics; usually they pass a portion of the data back to the process engineers and perhaps instruct the process engineers to make an adjustment to a tool in order to correct a defect. The process engineers traditionally monitor the tools and enter the tool-based information.)

In one or more embodiments of the present invention, the equipment based data is correlated with the product level information, as follows. The host system or MES system collects product level data, such as the activity in the fab on the wafer, and/or movements of the wafer, including into chambers, tools, etc. (Conventionally, the wafer movement information is accessible to the defect engineer.) From this product level information one may ascertain the path of the wafer(s) through the tools. The product level data does not, however, directly describe tool conditions.

If a user wishes to query the system in order to track the path of a particular wafer with an error, then using one or more embodiments of the present invention, the user may track what happened to the tool on which the wafer had a problem. Given a particular wafer with a problem, the system may use that information to determine the tool it was on when the problem may have occurred, and what the tool health was during the time the problem occurred. Then, using the identity of the tool, the relevant equipment-based data for that time period is extracted.

Figure 9:
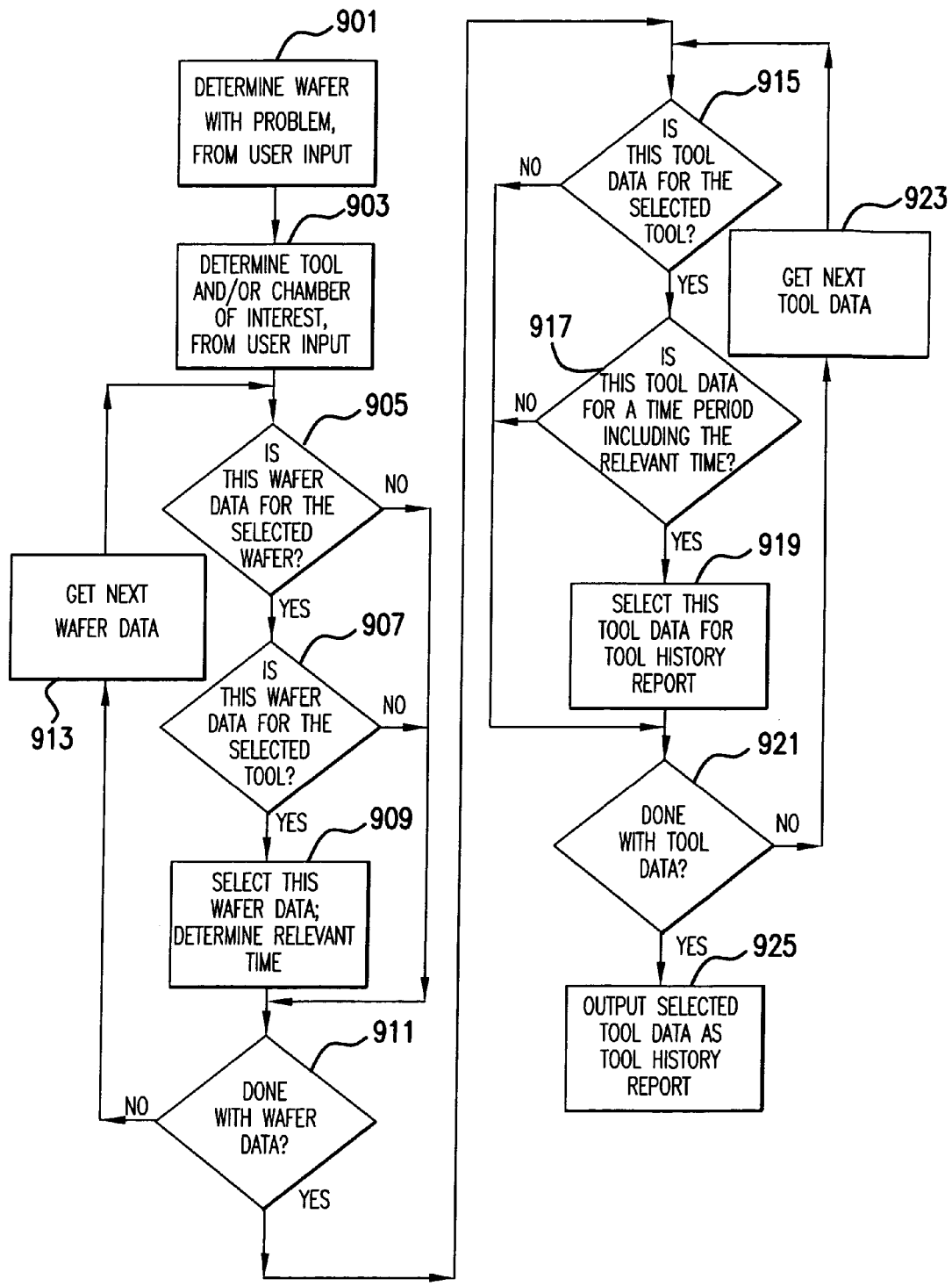
FIG. 9 is a flow chart according to one or more embodiments of the present invention for tracing a problematic wafer to a relevant tool history.

Consider a specific example of the foregoing, illustrated in FIG. 9. In this example, assume the defect engineers have become aware of a particular wafer which had a problem as well as the tool on which the wafer likely was located when the error occurred. They determine that, e.g., system five, chamber B, is where the error may have occurred. Using the present invention in this example, a query may be submitted to determine what happened on system five, chamber B at the time period when the wafer experienced the problem. Having cross-referenced the tool data (i.e., equipment based data) from the wafer data (i.e., product level data), the user can review and/or analyze the history for the tool. (This overcomes one of the problems with conventional troubleshooting where the past is not documented or tracked or if it is, it is in an unfriendly format that is difficult to interpret).

As illustrated in FIG. 9, according to one or more embodiments of the present invention, at step 901, the system determines the wafer with the problem, as specified by user input. At step 903, the system determines the tool and/or chamber of interest, as specified by user input. Next, the system loops to select the product level data (wafer) for the selected wafer, corresponding to the specified tool and determines the time period when the wafer of interest was on the tool and/or chamber of interest. Specifically, at step 905, the system determines whether the wafer data record (in the product level data) being referenced is for the selected wafer. If so, the system determines if this current wafer data record in the product level data corresponds to the selected tool, step 907. If so, the system selects this wafer data, and determines what the relevant time is from the selected product level data, step 909. If the system is not done with examining the wafer data (i.e., additional items of data are required for the analysis) as indicated at step 911, it fetches the next wafer data at step 913 and continues to loop.

If the system is done with the wafer data records, it then proceeds to the equipment-based data in order to obtain the relevant tool information, by referencing equipment-based data for the selected tool, at step 915, and determining whether the equipment-based data is for a time period including the relevant time 917. If the equipment-based data meets these criteria, then the record is selected and included in the tool history report, step 919. The system repeats until it is done with the equipment-based data, step 921, by getting the next equipment-based data 923. If the data is provided in a particular order, it can be searched in a more efficient manner. Once the system has processed the equipment-based data, it outputs the selected equipment-based data for the relevant tool and the relevant time period as a tool history report 925.

Figure 10:
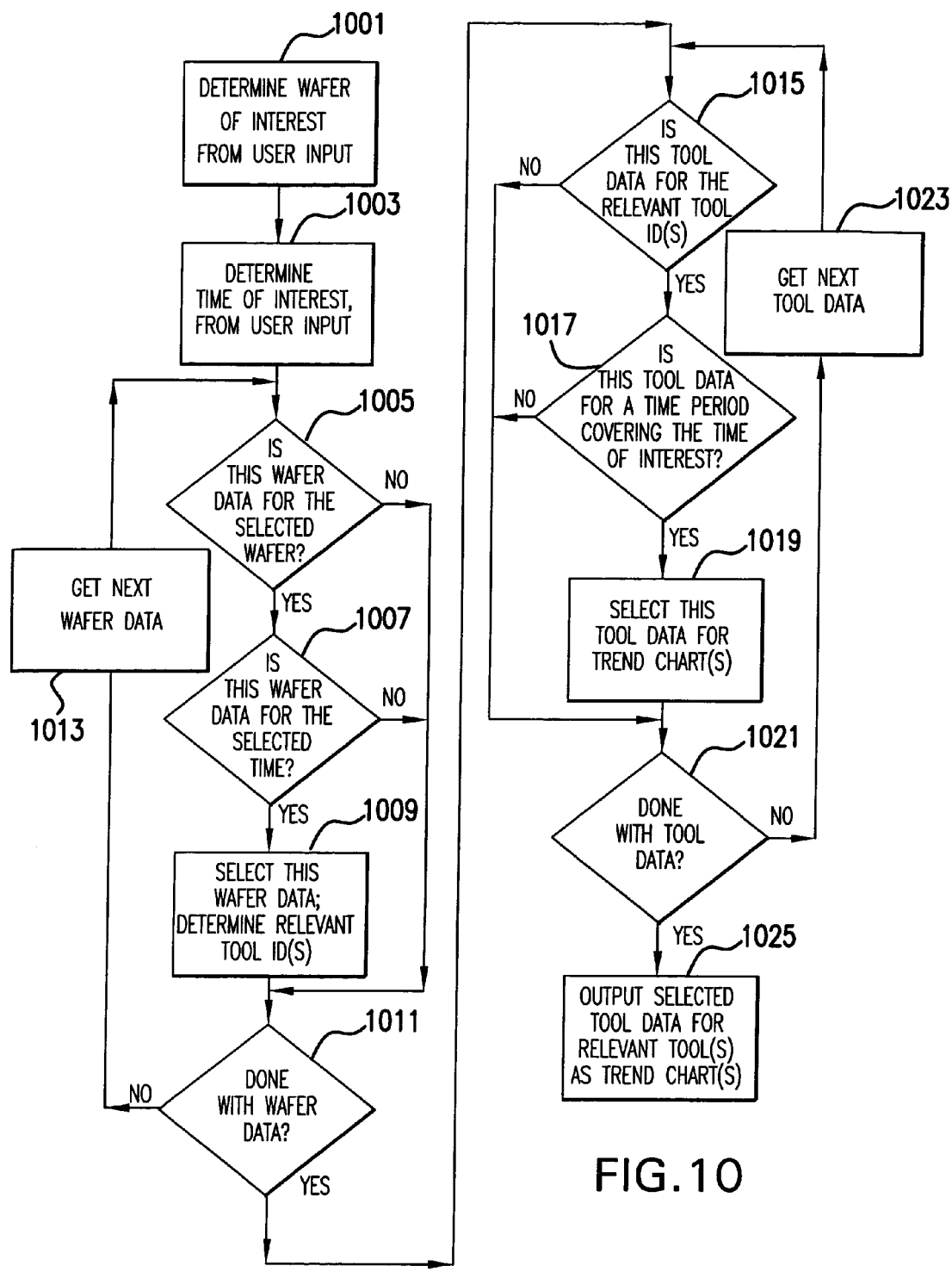
FIG. 10 is a flow chart according to one or more embodiments of the present invention for developing a trend report for a tool.

Another use of one or more embodiments of the present invention may be to determine trends. Reference is made to FIG. 10. In this example consider that a user may issue a query specifying a particular day and wafer (or batch of wafers), such as a day there was a problem with one or more wafers. In response, the system would search and ascertain that the equipment (various tools) on which the wafer was processed were in specification. Next, the user might query whether there was a trend over the week, e.g., although the chamber was in specification for a particular wafer (or batch of wafers) perhaps the wafers were degrading over the course of the week. Thus, although a snapshot of equipment-based data may reveal that the tool is within specification, a trend over time could be extrapolated to predict one or more next snapshots, e.g., one or more days later, and perhaps also indicate that the problem occurred between snapshots. If in fact the next day, e.g., shows a problem, there are potentially up to 24 hours worth of compromised product. Such a trend report may be not only therefore a snapshot of a moment, but also may be useful to illustrate how that moment correlates to the day before and the day after, or the week before and the week after, and/or that data in the snapshots may be extrapolated.

Again, referencing FIG. 10, a flowchart illustrates one or more embodiments of the present invention used in connection with developing a trend report for a tool of interest. At step 1001, the system determines the wafer of interest as specified in user input; and at step 1003, the system determines the time period or time periods that are of interest, also from user input. Having the specified wafer and the specified time period, the system next determines one or more relevant tool IDs from the product level data for the specified wafer during the specified time period(s). This is useful, e.g., when one knows that a wafer had an error which occurred at a specific time period(s) or during a specific day. The system loops through the wafer product-level data to select records relating to the wafer of interest, at the time(s) of interest, in order to determine the tool id of the tool(s) on which that wafer was processed. At step 1005, the system checks whether this record in the product-level data corresponds to the specified wafer. If so, at step 1007, the system determines whether this record data is also within the specified time(s) of interest. If so, the system selects this particular record in the product level data, and determines the relevant tool id from the selected record, step 1009. In order to continue looping through the product level data, if the system is not done with the search, step 1011, it gets the next record in the product level data 1013, and continues. If on the other hand the system has completed the search through the product level data, it then proceeds to the equipment-based data. In the equipment-based data, it selects the records in the equipment-based tool data corresponding to the time period(s) of interest. Hence, at step 1015, the system checks whether this record in the equipment based data corresponds to one or more of the determined tool identifications. If so, the system checks whether this record encompasses a time period including the time period (s) of interest. If so, information in this particular record in the equipment-based data is selected for inclusion into the trend chart, of which there may be one or more corresponding to the one or more determined tools, respectively, step 1019. If the system is not done searching through the tool equipment-based data, step 1021, it gets the next record in the equipment-based data, step 1023, and proceeds. If the system is done searching the equipment-based data, it then outputs at least some of the selected information in a report at step 1025, for the relevant tool(s), e.g., as trend charts.

As another example, consider that a user discovers there is a problem with at least one wafer on a particular chamber of a particular tool and wants to see what happened on the particular chamber on the day the problem occurred. According to one or more embodiments of the present invention, the user may specify the day (or other time period), the tool, and the chamber; a search may be performed to extract the data for the chamber from that day, including what was measured; and then a time-wise report may be prepared for the tool for the particular chamber.

According to one or more embodiments of the present invention, the user could request a report with more than one parameter, e.g., uniformity, thickness, x-ray, and/or etch rate measurements. Consider, e.g., that a defect problem was noted on product wafers. A selection of various reports show that the daily qual is clean from a particle point of view, the observed uniformity of production of wafers is in specification but the thickness is drifting upwards (e.g., temperature control in the chamber not working). However, if the deposit is too thick on the wafers being processed, a properly timed CMP polish on healthy equipment might not have sufficient time to polish away sufficient thickness, thereby creating a defect of film residue that would be noted following a measurement of the end product wafer. Because the CMP polish equipment is healthy, there is no defect in the equipment monitor wafer, i.e., daily qual. By tracking the thickness (in the product-level data) of the production wafers together with other parameters, the user may more easily be able to determine or even anticipate the root cause of the problem. For example, the information in the reports would lead to the conclusion that the film residue defect is due to excessive deposit, not inadequate polish.

Other types of reports may include various timing, e.g., by month, and/or different parameters that are measured. Different presentations are possible as well, to achieve a pleasing, user-friendly appearance conveying the information. Other information may include tools that run multiple processes such as in multiple chambers. For example, a report for the chamber running production showing that everything was fine, may include information that the adjacent chamber was down due to changes in the adjacent chamber.

Types of information that are collected on the wafers in the product-level data may include, e.g., different tool types, the tool ID number, and/or the different chamber information. Tool qualification information that is collected as part of the equipment level data may include, e.g., particles, mechanical particles in film, particles back side, thickness, x-ray and/or other information such as static information including tool configuration, number of chambers, etc.

The invention may be executed on any programmable computer system, such as, e.g., a personal computer. Preferably the computer has access to sufficient memory/storage to store the DKL for a relatively long period of time, e.g., six months storage time. (Six months should provide sufficient time to discover an excursion.)

The previously discussed scenarios concern a catastrophic failure from the defect point of view. There are, in addition, other uses of the present invention, such as to improve the performance of a baseline. Improving the baseline may include, e.g., reviewing of appropriate information such as trend charts, analyzing performance on average over time, and determining whether the information provided is such that an engineer can select a particular chamber or a particular part of the system to design and develop a improvement program. For example, it might be noted that chamber A is usually slightly high, so perhaps the procedure for chamber A could be improved in order to improve the overall performance on product wafers. The reports may provide sufficient history to analyze the usefulness of, and implement, a baseline improvement program.

Using the above example, a baseline improvement program means, a user determines via a report for a particular time period that for chamber A the thickness is always 500 mm higher than the other chamber. Although this measurement may be within tolerances according to the customer's requirement, it might be tightened. The engineer might note that, e.g., the PM (preventative maintenance) procedure on the relevant chamber is running a little bit hotter perhaps because of the way the PM was performed; and when the change to improve the chamber is made and the data is traced, a month's worth of data may be sufficient to observe trends and whether there is a sufficient alteration to accomplish the desired baseline change.

According to at least one embodiment of the present invention, a user could pre-determine which information to collect, and/or the length of time for collecting the data. Trend reports could be automatically generated, e.g., on a periodic basis, or when a threshold is rendered or a problem is imminent.

The selection of the information to track may be based on years of experience as a process engineer. Hence, the system preferably provides for flexibility and the possibility of user decisions. There may be changes effected within the system where the engineer adjusts one parameter and the system improves dramatically; there may also be small steps that may be taken over time.

Data collected by the system may have a variety of formats. The data may be stored as collected, and/or may be reformatted into a standardized format and stored. The data may be sorted and/or indexed, according to one or more embodiments of the present invention. The data may be stored in one or more databases.

The system may be implemented on a web based computer, e.g., via an interface to connect data from many sources and present one or more reports with selected information. The system may retrieve the information, and it may present it in reports and statistically meaningful trend charts. According to one or more embodiments of the present invention, the user may drill down to individual data points, so if the user wants a particular piece of data or information, the user may have access to it. The system may be implemented via any appropriate web-based tool, to extract data, review the data, compress it, compact it, structure a report and/or output graph.

While this invention has been described in conjunction with the specific embodiments outlined above, many alternatives, modifications and variations will be apparent to those skilled in the art. Accordingly, the preferred embodiments of the invention as set forth are intended to be illustrative and not limiting. Various changes may be made without departing from the spirit and scope of the invention as defined in the following claims.

For example, it would be possible to provide different graphical displays. Indeed, it may be desirable in some situations to alter the aesthetics of the display in order to better present the information. Different types of displays could be provided, e.g., line graph, bar graph, pie chart, text summary, etc. Also, data could be displayed numerically, such as in tables. Multiple reports could be combined, such as multiple superimposed line graphs. Moreover, it may be desirable in some situations to extrapolate information utilized in a report; such information could be used e.g., to predict and/or estimate behavior.

As another example, a report could be delivered or displayed pursuant to a specific request for a report. Also, a report could be delivered to a user for display; the delivery could be generated automatically, in response to an alarm condition, in response to a notification condition, in accordance with user request, etc. According to one or more embodiments an alarm or notification could be delivered by e-mail, and the report could be delivered as a document, or as a link at a website, and/or via e-mail. The report could be initiated and/or delivered in any appropriate manner.

As yet another example, the MES may be factory automation system with a general purpose computer, or a specially programmed special purpose computer. It may also be implemented including a distributed computer system rather than as a single computer; some of the distributed system might include embedded systems. Further, the programming may be distributed among processing devices and metrology tools and/or other parts of the process control system. Similarly, the processing could be controlled by a software program on one or more computer systems or processors, or could be partially or wholly implemented in hardware. Moreover, the factory automation system may communicate directly or indirectly with the relevant metrology tool(s), processing device(s), and metrology system(s); or the metrology tool(s), processing device(s) and metrology system(s) may communicate directly or indirectly with each other and the factory automation system.

Further, the invention has been described as being connected over a network, preferably the Internet. It is possible that the invention could be implemented over a much more limited network, such as an Intranet, or even on a single computer system. Moreover, portions of the system may be distributed (or not) over one or more computers, and some functions may be distributed to other hardware, such as tools, and still remain within the scope of this invention.

Figure 11:
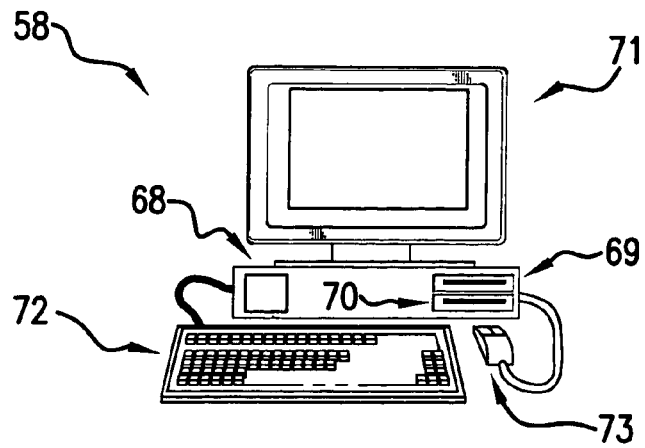
FIG. 11 is a diagram of a computer used for implementing one or more embodiments of the present invention, in accordance with a computer implemented embodiment.

The present invention may be implemented on a computer. FIG. 11 is an illustration of a computer 58 used for implementing the computer processing in accordance with a computer-implemented embodiment of the present invention. The procedures described herein may be presented in terms of program procedures executed on, e.g., a computer or network of computers.

Viewed externally in FIG. 11, computer 58 has a central processing unit (CPU) 68 having disk drives 69, 70. Disk drives 69, 70 are merely symbolic of a number of disk drives that might be accommodated by computer 58. Typically, these might be one or more of the following: a floppy disk drive 69, a hard disk drive (not shown), and a CD ROM or digital video disk, as indicated by the slot at 70. The number and type of drives varies, typically with different computer configurations. Disk drives 69, 70 are, in fact, options, and for space considerations, may be omitted from the computer system used in conjunction with the processes described herein.

Computer 58 also has a display 71 upon which information may be displayed. The display is optional for the computer used in conjunction with the system described herein. A keyboard 72 and/or a pointing device 73, such as a mouse 73, may be provided as input devices to interface with central processing unit 68. To increase input efficiency, keyboard 72 may be supplemented or replaced with a scanner, card reader, or other data input device. The pointing device 73 may be a mouse, touch pad control device, track ball device, or any other type of pointing device.

Figure 13:
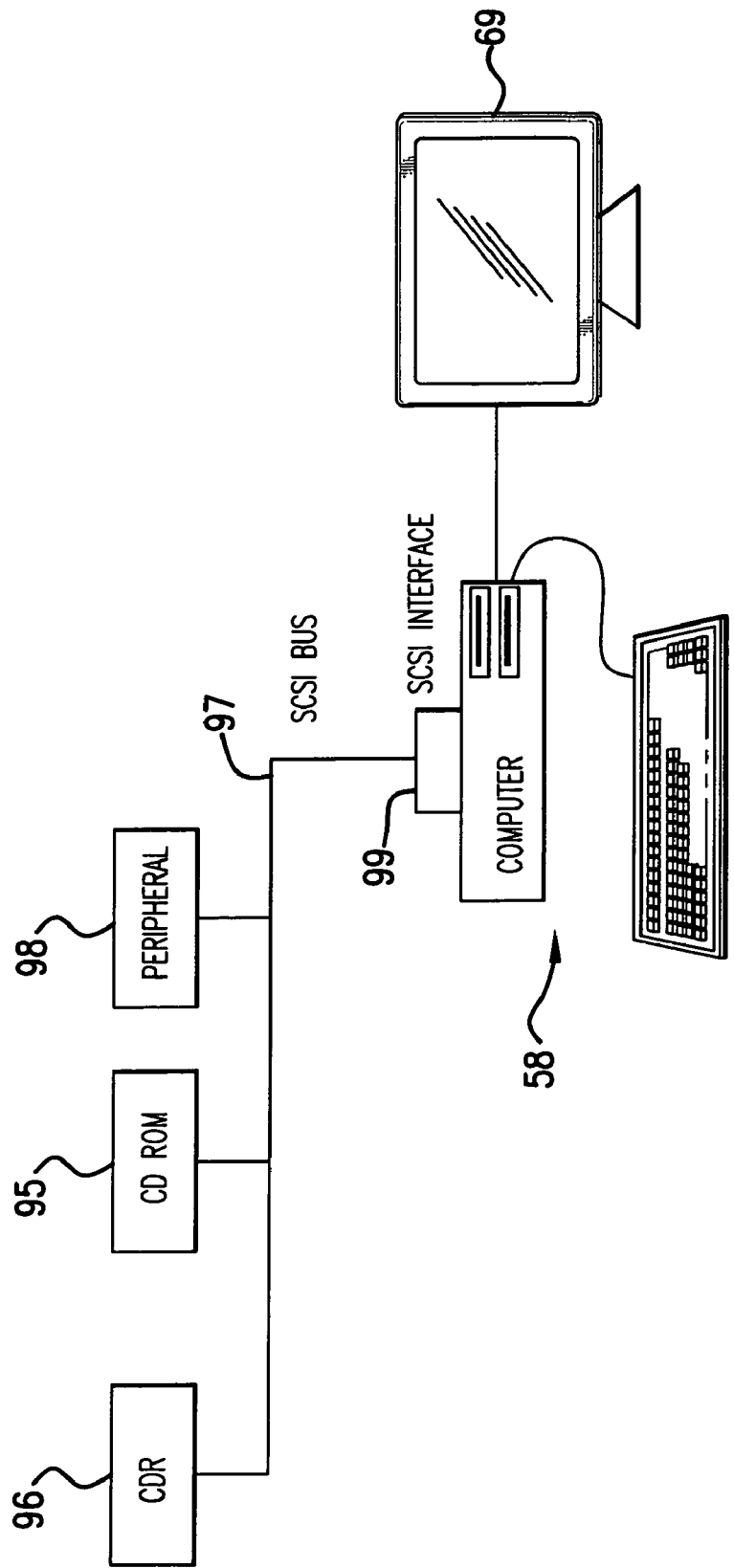
FIG. 13 is a block diagram of an alternative computer of a type suitable for carrying out one or more embodiments of the present invention.

Alternatively, referring to FIG. 13, computer 58 may also include a CD ROM reader 95 and CD recorder 96, which are interconnected by a bus 97 along with other peripheral devices 98 supported by the bus structure and protocol. Bus 97 serves as the main information highway interconnecting other components of the computer. It is connected via an interface 99 to the computer 58.

Figure 12:
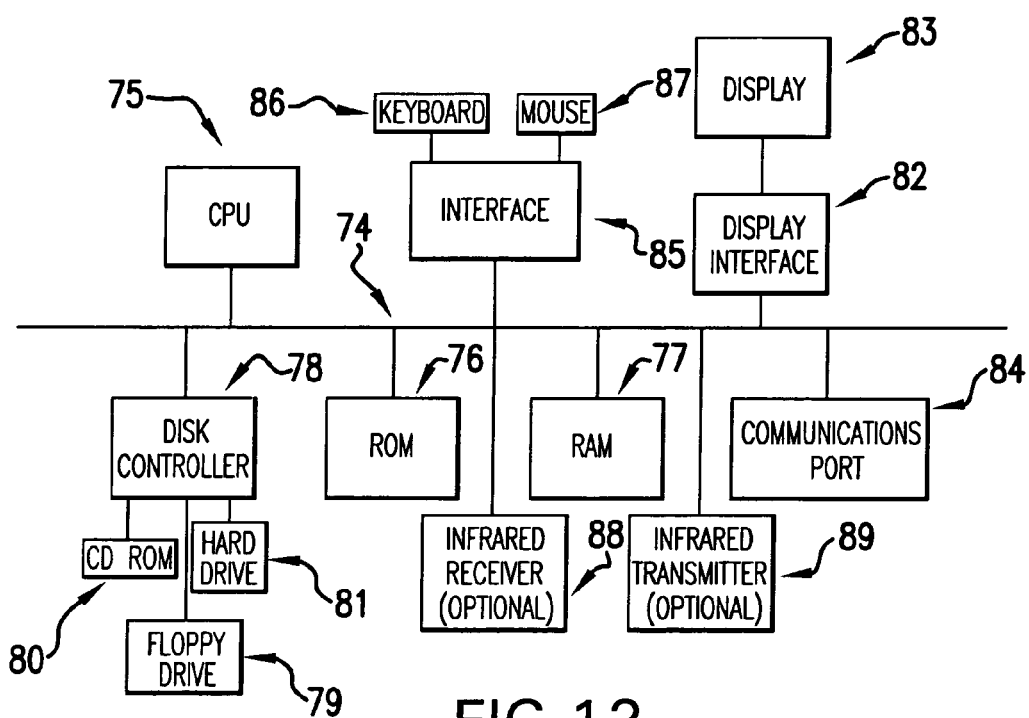
FIG. 12 is a block diagram of the internal hardware of the computer of FIG. 11.

FIG. 12 illustrates a step diagram of the internal hardware of the computer of FIG. 11. CPU 75 is the central processing unit of the system, performing calculations and logic operations required to execute a program. Read only memory (ROM) 76 and random access memory (RAM) 77 constitute the main memory of the computer. Disk controller 78 interfaces one or more disk drives to the system bus 74. These disk drives may be floppy disk drives such as 79, or CD ROM or DVD (digital video/versatile disk) drives, as at 80, or internal or external hard drives 81. As previously indicated these various disk drives and disk controllers are optional devices.

A display interface 82 permits information from bus 74 to be displayed on the display 83. Again, as indicated, the display 83 is an optional accessory for a central or remote computer in the communication network, as are infrared receiver 88 and transmitter 89. Communication with external devices occurs using communications port 84.

In addition to the standard components of the computer, the computer may also include an interface 85, which allows for data input through the keyboard 86 or pointing device, such as a mouse 87.

The system according to the invention may include a general purpose computer, or a specially programmed special purpose computer. The user may interact with the system via e.g., a personal computer or over PDA, e.g., the Internet, an intranet, etc. Either of these may be implemented as a distributed computer system rather than a single computer. Similarly, the communications link may be a dedicated link, a modem over a POTS line, and/or any other method of communicating between computers and/or users. Moreover, the processing could be controlled by a software program on one or more computer systems or processors, or could even be partially or wholly implemented in hardware.

Further, this invention has been discussed in certain examples as if it is made available to a single user. The invention may be used by numerous users, if preferred. The system used in connection with the invention may rely on the integration of various components including, as appropriate and/or if desired, hardware and software servers, database engines, and/or other content providers.

Although the computer system in FIG. 11 is illustrated as having a single computer, the system according to one or more embodiments of the invention is optionally suitably equipped with a multitude or combination of processors or storage devices. For example, the computer may be replaced by, or combined with, any suitable processing system operative in accordance with the principles of embodiments of the present invention, including sophisticated calculators, hand held, laptop/notebook, mini, mainframe and super computers, as well as processing system network combinations of the same. Further, portions of the system may be provided in any appropriate electronic format, including, e.g., provided over a communication line as electronic signals, provided on floppy disk, provided on CD ROM, provided on optical disk memory, etc.

Any presently available or future developed computer software language and/or hardware components can be employed in such embodiments of the present invention. For example, at least some of the functionality mentioned above could be implemented using Visual Basic, C, C++ or any assembly language appropriate in view of the processor being used. It could also be written in an interpretive environment such as Java and transported to multiple destinations to various users.

As another example, the system may be a general purpose computer, or a specially programmed special purpose computer. It may also be implemented to include a distributed computer system rather than as a single computer; some of the distributed system might include embedded systems. Similarly, the processing could be controlled by a software program on one or more computer systems or processors, or could be partially or wholly implemented in hardware.

As another example, the system may be implemented on a web based computer, e.g., via an interface to collect and/or analyze data from many sources. It may be connected over a network, e.g., the Internet, an Intranet, or even on a single computer system. Moreover, portions of the system may be distributed (or not) over one or more computers, and some functions may be distributed to other hardware, and still remain within the scope of this invention. The user may interact with the system via e.g., a personal computer or over PDA, e.g., the Internet, an intranet, etc. Either of these may be implemented as a distributed computer system rather than a single computer. Similarly, a communications link may be a dedicated link, a modem over a POTS line, and/or any other method of communicating between computers and/or users. Moreover, the processing could be controlled by a software program on one or more computer systems or processors, or could even be partially or wholly implemented in hardware.

User interfaces may be developed in connection with an HTML display format. It is possible to utilize alternative technology for displaying information, obtaining user instructions and for providing user interfaces.

The system used in connection with the invention may rely on the integration of various components including, as appropriate and/or if desired, hardware and software servers, database engines, and/or other process control components. The configuration may be, alternatively, network-based and may, if desired, use the Internet as an interface with the user.

The system according to one or more embodiments of the invention may store collected information in a database. An appropriate database may be on a standard server, e.g., a small Sun™ Sparc™ or other remote location. The information may, e.g., optionally be stored on a platform that may, e.g., be UNIX-based. The various databases may be in, e.g., a UNIX format, but other standard data formats may be used. The database optionally is distributed and/or networked.

Although the system is illustrated as having a single computer, the system according to one or more embodiments of the invention is optionally suitably equipped with a multitude or combination of processors or storage devices. For example, the computer may be replaced by, or combined with, any suitable processing system operative in accordance with the principles of embodiments of the present invention, including sophisticated calculators, hand held, laptop/notebook, mini, mainframe and super computers, one or more embedded processors, as well as processing system network combinations of the same. Further, portions of the system may be provided in any appropriate electronic format, including, e.g., provided over a communication line as electronic signals, provided on floppy disk, provided on CD ROM, provided on optical disk memory, etc.

The invention may include a process and/or steps. Where steps are indicated, they may be performed in any order, unless expressly and necessarily limited to a particular order. Steps that are not so limited may be performed in any order.

What is claimed is:

1. A computer-implemented method for monitoring production of a plurality of semiconductor products to detect potential defect excursions, comprising:
    (a) collecting equipment based data reflecting equipment performance for a plurality of semiconductor manufacturing tools used for processing the plurality of semiconductor products;
    (b) collecting product level data reflecting product quality for said plurality of semiconductor products processed on said plurality of manufacturing tools;
    (c) determining a correlation of at least a portion of said product level data and at least a portion of said equipment based data, wherein determining the correlation includes:
        receiving an indication of at least one semiconductor product of interest;
        receiving an indication of a selected time period;
        locating, in the equipment based data, at least one of the plurality of manufacturing tools on which said at least one semiconductor product of interest was processed; and
        locating, in the product level data, at least one of the product level data corresponding to the at least one semiconductor product of interest, the at least one located manufacturing tool, and including or proximate to the selected time period; and
    (d) providing at least one report of said correlation of data.

2. The method of claim 1, wherein the equipment based data is selected from at least one of: bare wafer measurement data, daily qualification data, unpatterned wafer measurement data, equipment electrical output signals, patterned short loop wafer measurement data, and product measurement data.

3. The method of claim 1, wherein the product level data is selected from at least one of: defect imaging data, defect measurement data, patterned wafer data, electrical performance data and wafer movement data.

4. The method of claim 1, wherein the report includes a format selected from at least one of: a numerical report, a graphical report, a tabular report and a text report.

5. The method of claim 1, wherein said report of said correlation of data comprises an arrangement of ordered elements, and wherein said arrangement is over a period of time, the period of time being selected from at least one of: at least one day, at least one week, at least one month, at least one quarter, and at least one year.

6. The method of claim 1, wherein determining a correlation of at least a portion of said product level data and at least a portion of said equipment based data comprises determining the correlation based on information characterizing the movement of at least one semiconductor product among the manufacturing tools reflected in the product level data.

7. The method of claim 1, further comprising extrapolating the correlated data, and including the extrapolation in the report.

8. The method of claim 1, further comprising storing the at least one report, and responsive to a further request on behalf of a user, retrieving the at least one report for benchmarking.

9. A computer-implemented method for monitoring production of a plurality of semiconductor products to detect potential defect excursions, comprising:
  (a) collecting equipment based data reflecting equipment performance for a plurality of semiconductor manufacturing tools used for processing the plurality of semiconductor products;
  (b) collecting product level data reflecting product quality for said plurality of semiconductor products processed on said plurality of manufacturing tools;
  (c) determining a correlation of at least a portion of said product level data and at least a portion of said equipment based data, wherein determining the correlation includes:
    receiving an indication of at least one semiconductor product of interest;
    receiving an indication of at least one manufacturing tool of interest;
    locating, in the equipment based data, a relevant time period for the at least one manufacturing tool of interest during which said at least one semiconductor product of interest was processed; and
    locating, in the product level data, at least one of the product level data corresponding to the at least one semiconductor product of interest, the at least one located manufacturing tool, and including or proximate to the selected time period; and
  (d) providing at least one report of said correlation of data.

10. A computer-implemented method for monitoring production of a plurality of semiconductor products to detect potential defect excursions, comprising:
  (a) collecting equipment based data reflecting equipment performance for a plurality of semiconductor manufacturing tools used for processing the plurality of semiconductor products;
  (b) collecting product level data reflecting product quality for said plurality of semiconductor products processed on said plurality of manufacturing tools;
  (c) determining a correlation of at least a portion of said product level data and at least a portion of said equipment based data, wherein determining the correlation includes:
    receiving an indication of at least one manufacturing tool of interest;
    receiving an indication of a selected time period;
    locating, in the equipment based data, information reflecting the at least one manufacturing tool of interest including or proximate to the selected time period; and
    locating, in the product level data, at least one of the semiconductor products corresponding to the at least one manufacturing tool of interest, and including or proximate to the selected time period; and
  (d) providing at least one report of said correlation of data.

11. A computer-implemented system for monitoring production of a plurality of semiconductor products to detect potential defect excursions, comprising:
  (A) a first data store to store a collection of equipment based data reflecting equipment performance for a plurality of the semiconductor manufacturing tools used for processing the plurality of semiconductor products;
  (B) a second data store to store a collection of product level data reflecting product quality for said plurality of semiconductor products processed on said plurality of semiconductor manufacturing tools; and
  (C) a computer system for determining a correlation of at least a portion of said product level data and at least a portion of said equipment based data, wherein the correlation is determined by receiving an indication of at least one semiconductor product of interest, receiving an indication of a selected time period, locating, in the equipment based data, at least one of the plurality of manufacturing tools on which said at least one semiconductor product of interest was processed, and locating, in the product level data, at least one of the product level data corresponding to the at least one semiconductor product of interest, the at least one located manufacturing tool, and including or proximate to the selected time period, said computer system also generating at least one report of said correlation of data.

12. The system of claim 11, wherein the equipment based data is selected from at least one of: bare wafer measurement data, daily qualification data, unpatterned wafer measurement data, equipment electrical output signals, patterned short loop wafer measurement data, and product measurement data.

13. The system of claim 11, wherein the product level data is selected from at least one of: defect imaging data, defect measurement data, patterned wafer data, electrical performance data, and wafer movement data.

14. The system of claim 11, wherein the report includes a format selected from at least one of: a numerical report, a graphical report, a tabular report and a text report.

15. The system of claim 11, wherein the report comprises an arrangement or ordered elements, said arrangement being over a period of time, the period of time being selected from at least one of: at least one day, at least one week, at least one month, at least one quarter, and at least one year.

16. The system of claim 11, wherein the correlation is based on information characterizing the movement of at least one semiconductor product among the manufacturing tools reflected in the product level data.

17. The system of claim 11, wherein the correlated data is extrapolated, and wherein the report includes the extrapolation.

18. The system of claim 11, wherein a plurality of reports are stored including the at least one report, and at least a portion of the plurality of reports are used for benchmarking.

19. A computer-implemented system for monitoring production of a plurality of semiconductor products to detect potential defect excursions, comprising:
(A) a first data store to store a collection of equipment based data reflecting equipment performance for a plurality of the semiconductor manufacturing tools used for processing the plurality of semiconductor products;
(B) a second data store to store a collection of product level data reflecting product quality for said plurality of semiconductor products processed on said plurality of semiconductor manufacturing tools; and
(C) a computer system for determining a correlation of at least a portion of said product level data and at least a portion of said equipment based data, wherein the correlation is determined by receiving an indication of at least one semiconductor product of interest, receiving an indication of at least one manufacturing tool of interest, locating, in the equipment based data, a relevant time period for the at least one manufacturing tool of interest during which said at least one semiconductor product of interest was processed, and locating, in the product level data, at least one of the product level data corresponding to the at least one semiconductor product of interest, the at least one located manufacturing tool, and including or proximate to the selected time period, said computer system also generating at least one report of said correlation of data.

20. A computer-implemented system for monitoring production of a plurality of semiconductor products to detect potential defect excursions, comprising:
(A) a first data store to store a collection of equipment based data reflecting equipment performance for a plurality of the semiconductor manufacturing tools used for processing the plurality of semiconductor products;
(B) a second data store to store a collection of product level data reflecting product quality for said plurality of semiconductor products processed on said plurality of semiconductor manufacturing tools; and
(C) a computer system for determining a correlation of at least a portion of said product level data and at least a portion of said equipment based data, wherein the correlation is determined by receiving an indication of at least one manufacturing tool of interest, receiving an indication of a selected time period, locating, in the equipment based data, information reflecting the at least one manufacturing tool of interest including or proximate to the selected time period, and locating, in the product level data, at least one of the semiconductor products corresponding to the at least one manufacturing tool of interest, and including or proximate to the selected time period, said computer system also generating at least one report of said correlation of data.

21. A computer program for monitoring production of a plurality of semiconductor products to detect potential defect excursions, comprising:
(a) at least one computer readable medium;
(b) instructions, provided on the at least one computer readable medium, for collecting equipment based data reflecting equipment performance for a plurality of the semiconductor manufacturing tools used for processing the plurality of semiconductor products;
(c) instructions, provided on the at least one computer readable medium, for collecting product level data reflecting product quality for said plurality of semiconductor products processed on said plurality of semiconductor manufacturing tools;
(d) instructions, provided on the at least one computer readable medium, for determining a correlation of at least a portion of said product level data and at least a portion of said equipment based data, wherein the instructions for determining include instructions for:
receiving an indication of at least one semiconductor product of interest;
receiving an indication of a selected time period;
locating, in the equipment based data, at least one of the plurality of manufacturing tools on which said at least one semiconductor product of interest was processed; and
locating, in the product level data, at least one of the product level data corresponding to the at least one semiconductor product of interest, the at least one located manufacturing tool, and including or proximate to the selected time period; and
(e) instructions, provided on the at least one computer readable medium, for providing, at least one report of said correlation of data.

22. The device of claim 21, wherein the equipment based data is selected from at least one of: bare wafer measurement data, daily qualification data, unpatterned wafer measurement data, equipment electrical output signals, patterned short loop wafer measurement data, and product measurement data.

23. The device of claim 21, wherein the product level data is selected from at least one of: defect imaging data, defect measurement data, patterned wafer data, electrical performance data, and wafer movement data.

24. The device of claim 21, wherein the report includes a format selected from at least one of: a numerical report, a graphical report, a tabular report and a text report.

25. The device of claim 21, wherein the report comprises an arrangement of ordered elements, and wherein said arrangement is over a period of time, the period of time being selected from at least one of: at least one day, at least one week, at least one month, at least one quarter, and at least one year.

26. The device of claim 21, wherein the instructions for determining include instructions to determine the correlation based on information characterizing the movement of at least one semiconductor product among the manufacturing tools reflected in the product level data.

27. The device of claim 21, further comprising instructions for extrapolating the correlated data, and including the extrapolation in the report.

28. The device of claim 21, further comprising instructions for storing the at least one report, and responsive to a further request on behalf of a user, for retrieving the at least one report for benchmarking.

29. A computer program for monitoring production of a plurality of semiconductor products to detect potential defect excursions, comprising:
(a) at least one computer readable medium;
(b) instructions, provided on the at least one computer readable medium, for collecting equipment based data reflecting equipment performance for a plurality of the semiconductor manufacturing tools used for processing the plurality of semiconductor products;
(c) instructions, provided on the at least one computer readable medium, for collecting product level data reflecting product quality for said plurality of semiconductor products processed on said plurality of semiconductor manufacturing tools;

(d) instructions, provided on the at least one computer readable medium, for determining a correlation of at least a portion of said product level data and at least a portion of said equipment based data, wherein the instructions for determining include instructions for:

receiving an indication of at least one semiconductor product of interest;

receiving an indication of at least one manufacturing tool of interest;

locating, in the equipment based data, a relevant time period for the at least one manufacturing tool of interest during which said at least one semiconductor product of interest was processed; and locating, in the product level data, at least one of the product level data corresponding to the at least one semiconductor product of interest, the at least one located manufacturing tool, and including or proximate to the selected time period; and (e) instructions, provided on the at least one computer readable medium, for providing, at least one report of said correlation of data.

30. A computer program for monitoring production of a plurality of semiconductor products to detect potential defect excursions, comprising:

(a) at least one computer readable medium;

(b) instructions, provided on the at least one computer readable medium, for collecting equipment based data reflecting equipment performance for a plurality of the semiconductor manufacturing tools used for processing the plurality of semiconductor products;

(c) instructions, provided on the at least one computer readable medium, for collecting product level data reflecting product quality for said plurality of semiconductor products processed on said plurality of semiconductor manufacturing tools;

(d) instructions, provided on the at least one computer readable medium, for determining a correlation of at least a portion of said product level data and at least a portion of said equipment based data, wherein the instructions for determining include instructions for:

receiving an indication of at least one manufacturing tool of interest;

receiving an indication of a selected time period;

locating, in the equipment based data, information reflecting the at least one manufacturing tool of interest including or proximate to the selected time period; and locating, in the product level data, at least one of the semiconductor products corresponding to the at least one manufacturing tool of interest, and including or proximate to the selected time period; and (e) instructions, provided on the at least one computer readable medium, for providing, at least one report of said correlation of data.

* * * * *